United States Patent
Yoshimura et al.

(10) Patent No.: US 6,845,022 B2
(45) Date of Patent: Jan. 18, 2005

(54) POWER CONVERSION APPARATUS AND POWER CONVERSION SYSTEM HAVING THE POWER CONVERSION APPARATUS

(75) Inventors: Kousuke Yoshimura, Tokyo (JP); Noboru Miyamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/676,610

(22) Filed: Oct. 2, 2003

(65) Prior Publication Data
US 2004/0196678 A1 Oct. 7, 2004

(30) Foreign Application Priority Data
Apr. 3, 2003 (JP) ........................................ 2003-100306

(51) Int. Cl.[7] ............................................... H02M 7/44
(52) U.S. Cl. ......................................................... 363/95
(58) Field of Search .............................. 363/95, 97, 98, 363/131, 132

(56) References Cited

U.S. PATENT DOCUMENTS

| | | | | |
|---|---|---|---|---|
| 6,081,104 A | * | 6/2000 | Kern | 323/268 |
| 6,154,379 A | * | 11/2000 | Okita | 363/40 |
| 6,201,720 B1 | * | 3/2001 | Tracy et al. | 363/95 |
| 6,603,672 B1 | * | 8/2003 | Deng et al. | 363/37 |

* cited by examiner

Primary Examiner—Adolf Berhane
(74) Attorney, Agent, or Firm—Oblon, Spivak, McClelland, Maier & Neustadt, P.C.

(57) ABSTRACT

A power conversion apparatus of this invention includes a power switching device, a voltage sensor, a current sensor, and a device controller connected to the switching device, the voltage sensor, and the current sensor. The voltage sensor detects an output voltage of the switching device to output a first signal depending on the output voltage, and the current sensor detects an output current of the switching device to output a second signal depending on the output current. The device controller includes a driver connected to the switching device and a correcter connected to the driver, the voltage sensor and the current sensor. The driver outputs a third drive signal to the switching device. The correcter monitors a switching loss and a surge voltage by using the first and second signals, and corrects the third signal depending on values of the switching loss and the surge voltage.

19 Claims, 27 Drawing Sheets

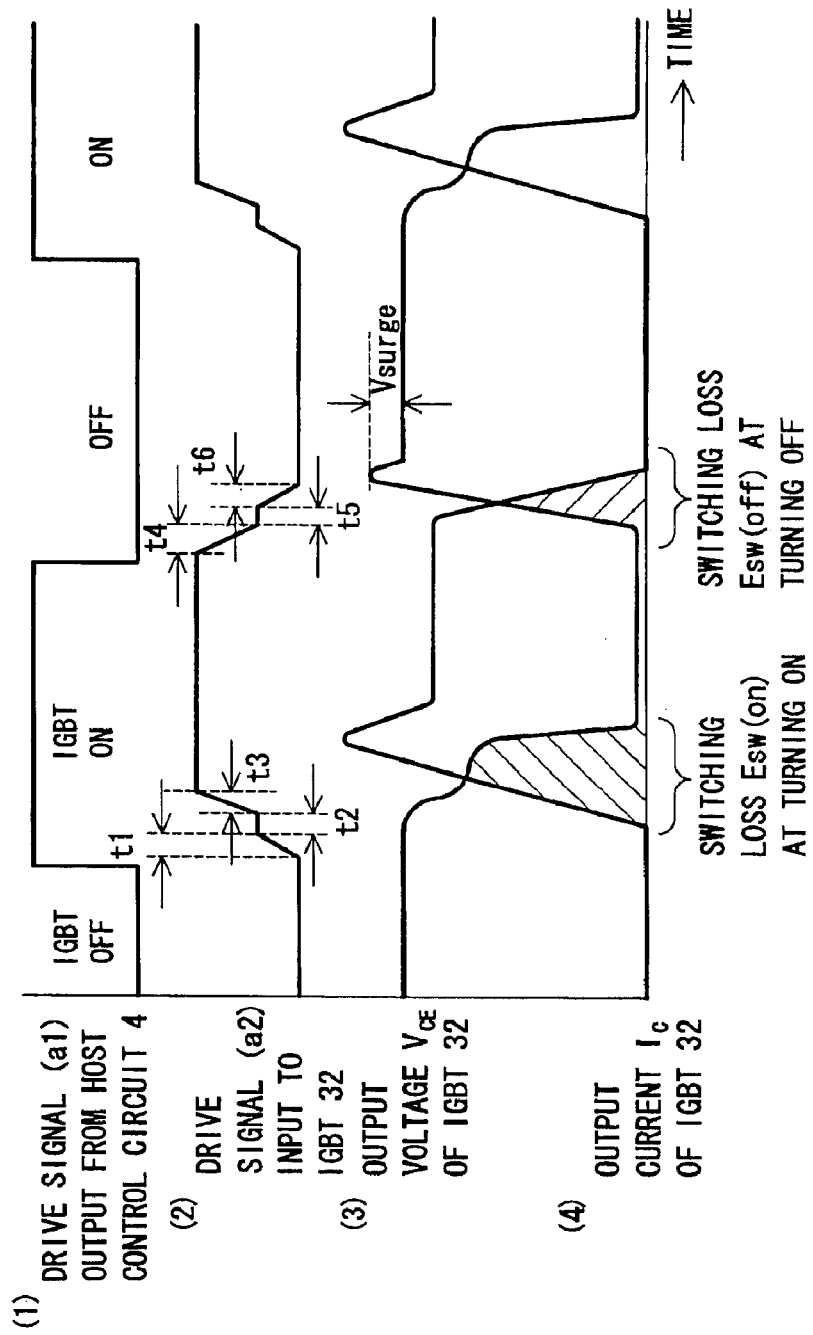

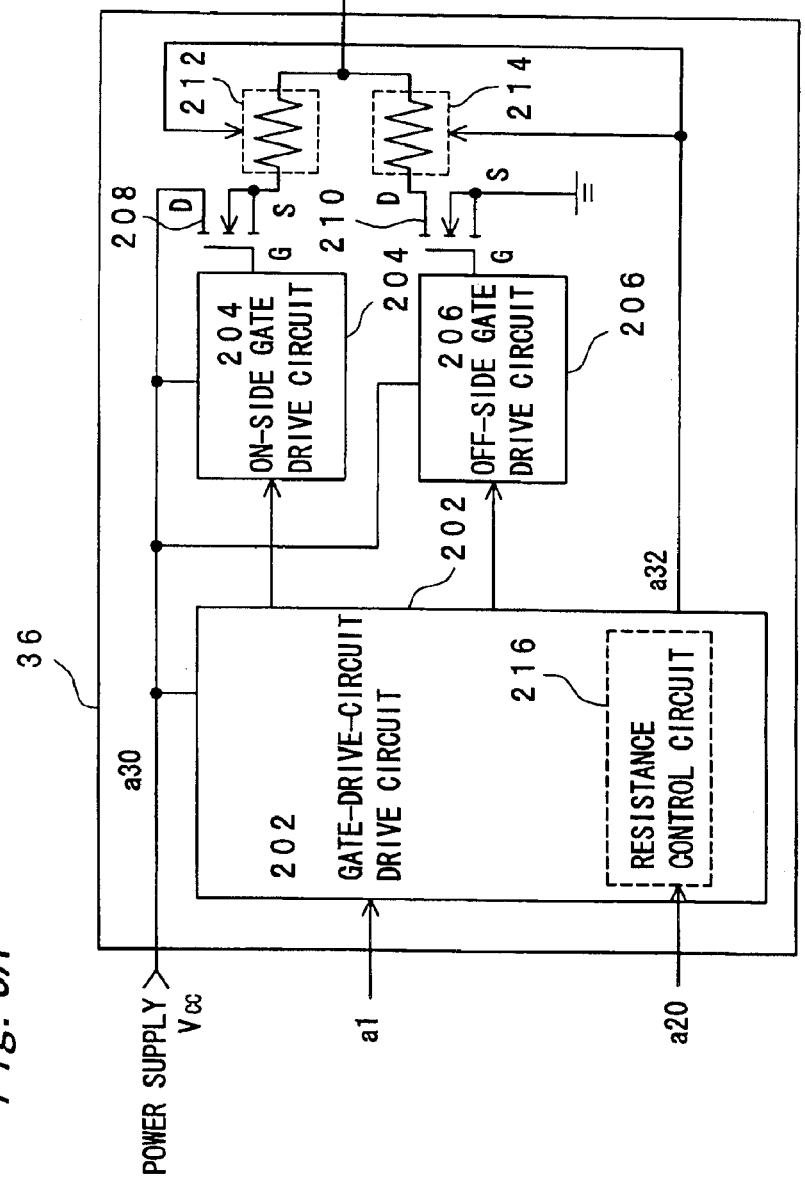
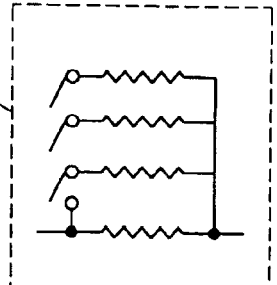
Fig. 5A
Fig. 5B

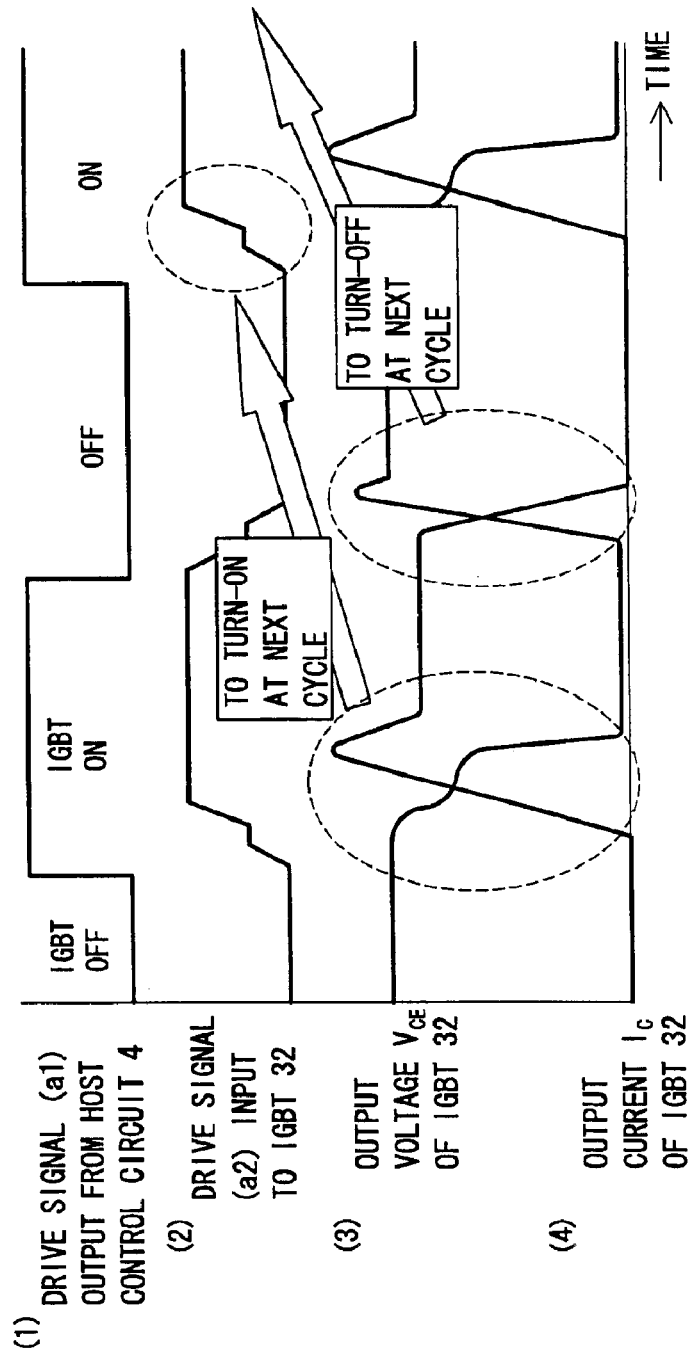

US 6,845,022 B2

POWER CONVERSION APPARATUS AND POWER CONVERSION SYSTEM HAVING THE POWER CONVERSION APPARATUS

BACKGROUND OF THE INVENTION

1. Field of the Invention

The present invention relates to a power conversion apparatus used in an inverter and a power conversion system having the power conversion apparatus.

2. Description of the Related Art

An inverter applied to general industrial machines or automobiles generally has a power conversion apparatus which drives a motor (load). When the inverter is, for example, a three-phase inverter, the power conversion apparatus includes insulated gate bipolar transistors (referred to as an "IGBT" hereinafter) in the phases U, V, and W, free wheel diodes (referred to as an "FWD" hereinafter) each of which is connected to each IGBT by back-to-back, and a device control circuit which controls these power devices (One power device consists of one IGBT and one FWD.). The device control circuit generally includes an interface circuit which exchanges signals with a host control circuit, a drive circuit which drives power devices, a protection circuit which detects an abnormality such as overvoltages or overcurrents of the power devices to protect the power devices from breakdown. The protection circuit has resistors to divide a voltage (referred to as "voltage-dividing resistors", hereinafter) and a comparator. The comparator compares the value of a signal output from each of various sensors with a predetermined reference value (a value of a voltage generated by a reference voltage and the voltage-dividing resistors). The protection circuit outputs a signal designating to cut-off the gate of the IGBT or the like when the value of the signal output from each of various sensors exceeds (or is lower than) the reference value. By this protection circuit, the IGBT and the motor can be prevented from being broken by overheat, overcurrent (short-circuit or overload), and overvoltage of the IGBT, a decrease in the voltage of a power supply of the device control circuit, and the like.

Important characteristics of the above-mentioned power conversion apparatus are a switching loss at turning-on and turning-off of the IGBT and a surge voltage at turning-off. The switching loss (ESW (ON)/ESW (OFF)) is expressed by a product between an output voltage (collector-emitter voltage $V_{CE}$) and an output current ($I_C$) of the IGBT. The switching loss means an energy loss in a switching operation of the power conversion apparatus, therefore, it is desirable to minimize the switching loss.

The surge voltage ($V_{surge}$) is defined by an equation (1) by using a parasitic inductance L generated by the internal and external wires of the power conversion apparatus, and a rate of a change of the output current $I_C$ of the IGBT (OFF) at switching off it.

$$V_{surge} = dI_c(\text{OFF})/dt \times L \qquad (1)$$

The surge voltage affects the withstand voltages of the IGBT and the FWD. Under conditions that value of the output current $I_C$ is equal, areas occupied by the IGBT and the FWD on a chip increase as the withstand voltages thereof decrease. For this reason, from the viewpoint of cost, it is desirable to minimize the surge voltage. The trade-off is established between the surge voltage and the switching loss.

For example, some conventional inverter includes two inverter circuits connected in parallel to each other, and a control circuit for controlling output voltages of these inverter circuits by a phase control signal. The inverter detects the frequency of a surge voltage at an output voltage obtained by synthesizing the two output voltages, and correct the phase control signal by using the detected frequency to suppress the surge voltage (refer to, for example, Laid-Open Japanese Patent Publication No. 10-225130).

Generally, the output voltage (collector-emitter voltage) $V_{CE}$ of the IGBT and the output current $I_C$ thereof are determined by characteristics of the IGBT and those of each component of a drive circuit to drive it. And, those characteristics are independent with each other. Thus, the output voltage and the output current vary depending on a variation in each component, a variation of characteristics of each component by temperature change, aging, or the like. The variation of the output voltage and that of the output current causes the variation of the switching loss and that of the surge voltage. When the variations of the switching loss and the surge voltage are excessively large, the characteristics of the power conversion apparatus are deteriorated, and the power conversion apparatus and the motor load erroneously operate in some cases.

The Laid-Open Japanese Patent Publication No. 10-225130 or the like discloses an inverter to suppress a surge voltage. However, it does not mention the deterioration of characteristics caused by an increase in switching loss.

Also, the variation of a predetermined protection level in the protection circuit deteriorates a protection function, and therefore degrades the characteristics of the power conversion apparatus. This is due to that the protection level is predetermined, but actually varies as an output voltage $V_{CE}$ of an IGBT, an output current $I_C$ thereof, and the characteristics of detection circuits therefor vary depending on the temperature change, aging, or the like, even though the condition of controlling them is same. Therefore, in some cases, the IGBT is detected to operate abnormally, even though the IGBT does not abnormally operate. Conclusively, the power conversion apparatus disadvantageously performs an erroneous operation.

As a result, the conventional power conversion apparatus cannot avoid deterioration of its characteristics.

SUMMARY OF THE INVENTION

It is an object of the present invention to provide a power conversion apparatus whose characteristics are not adversely affected by a change in environment, aging, and the like.

A power conversion apparatus according to the present invention includes a power switching device, a voltage sensor which detects an output voltage of the switching device to output a first signal depending on the output voltage, a current sensor which detects an output current of the switching device to output a second signal depending on the output current, and a device controller connected to the switching device, the voltage sensor, and the current sensor. The device controller includes a driver connected to the switching device, and a correcter connected to the driver, the voltage sensor and the current sensor, the driver outputs a third drive signal to the switching device. The correcter obtains the first signal from the voltage sensor, the second signal from the current sensor, and the third signal from the driver, calculates a switching loss by using a value of the first signal and a value of the second signal, compares a value of the switching loss with a first reference value, and the value of the first signal with a second reference value, and corrects the value of the third signal, when at least one of a condition in which the value of the switching loss exceeds the first reference value and a condition in which the value of the first signal exceeds the second reference value is satisfied, such that the exceeding value is not larger than the corresponding reference value.

According to a power conversion apparatus according to the present invention, a power conversion apparatus whose characteristics are not adversely affected by a change in environment, aging, and the like can be realized.

BRIEF DESCRIPTION OF THE DRAWINGS

Additional objects and advantages of the present invention will be apparent from the following detailed description of preferred embodiments thereof, which are best understood with reference to the accompanying drawings.

FIG. 4 is a waveform chart for explaining the drive signal input to an IGBT and an operation of the IGBT.

FIGS. 5A and 5B are circuit diagrams of a drive circuit.

FIG. 18 is a waveform chart for explaining an operation of a correction circuit of a power conversion apparatus according to a second embodiment of the present invention.

DETAILED DESCRIPTION OF THE PREFERRED EMBODIMENTS

The following description is a detailed description of the main embodiments of the invention, with reference to the drawings in which the same numerical references identify the same elements in each of the different figures.

First Embodiment

Figure 1:
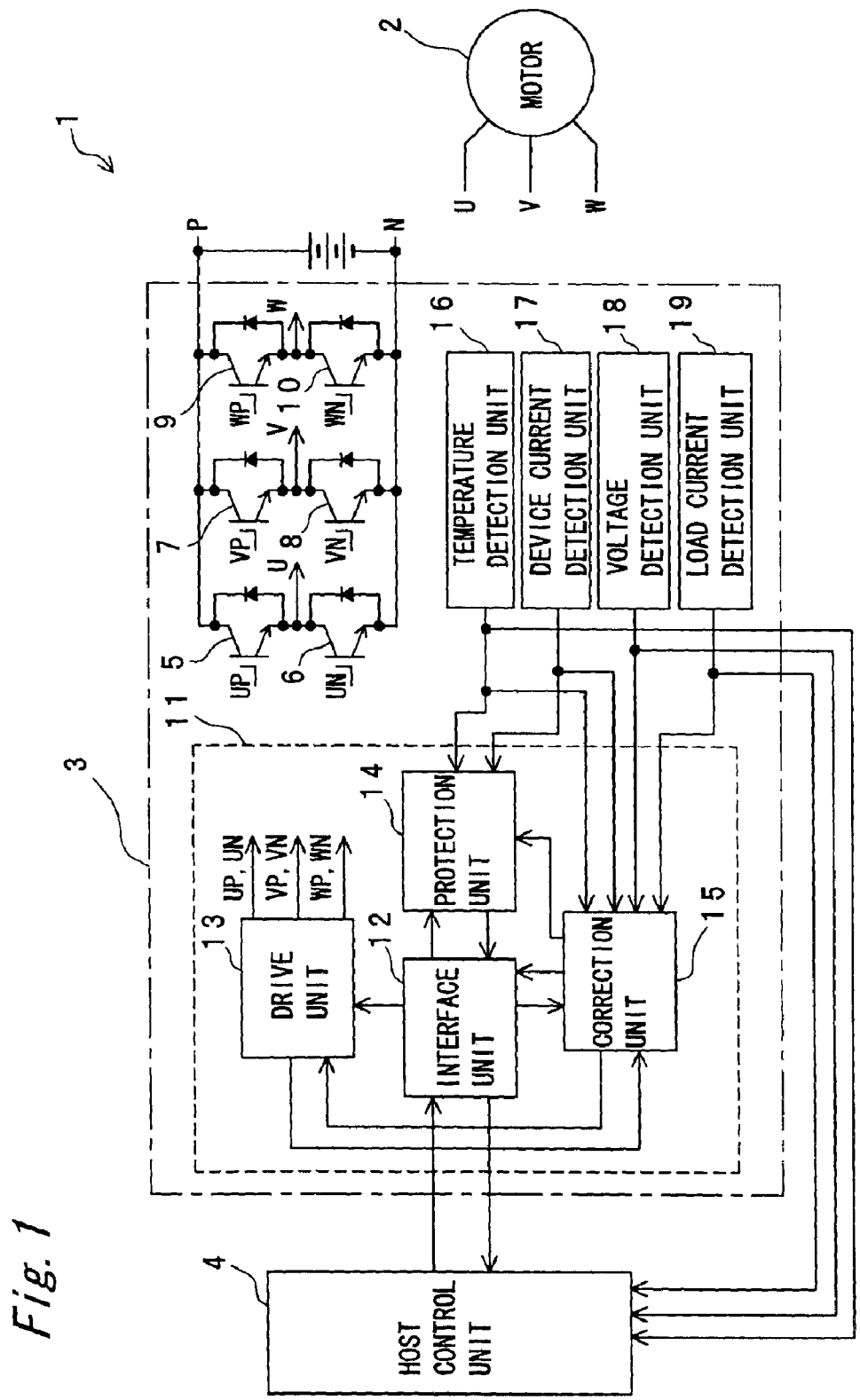
FIG. 1 is a block diagram of an inverter according to the present invention.

FIG. 1 is a block diagram of an inverter according to the present invention. As shown in FIG. 1, an inverter 1 is a three-phase inverter including a power conversion unit 3 which drives a motor (load) 2, and a host control unit (PMW signal generation unit) 4 which controls the power conversion unit 3. The power conversion unit 3 has six power devices (5–10), and a device control unit 11, which controls the power devices (5–10). Each of the power devices (5–10) is consisted of one IGBT and one FWD connected to the IGBT by back-to-back connection. The device control unit 11 includes an interface unit 12 which exchanges signals with the host control circuit 4, a drive unit 13 which drives the power devices (5–10), a protection unit 14 which detects an abnormality in the power devices (5–10) to protect the power devices, and a correction unit 15 which corrects the operations of the drive unit 13 and the protection unit 14 depending on the operation states of the power devices (5–10). The power conversion unit 3 further includes a temperature detection unit 16 which detects temperatures of the power devices (5–10), a device current detection unit 17 which detects output currents ($I_C$) from the IGBTs, a voltage detection unit 18 which detects collector-emitter voltages ($V_{CE}$) of the IGBTs, and a load current detection unit 19 which detects a current flowing in the motor 2.

The power conversion unit 3 can be consisted of one or more integrated circuit (IC) chips. First, a case in which the power conversion unit 3 is consisted of six IC chips will be described. In this case, the host control unit 4 is a single host control circuit (for example, a microcomputer) which controls the six IC chips.

Figure 2:
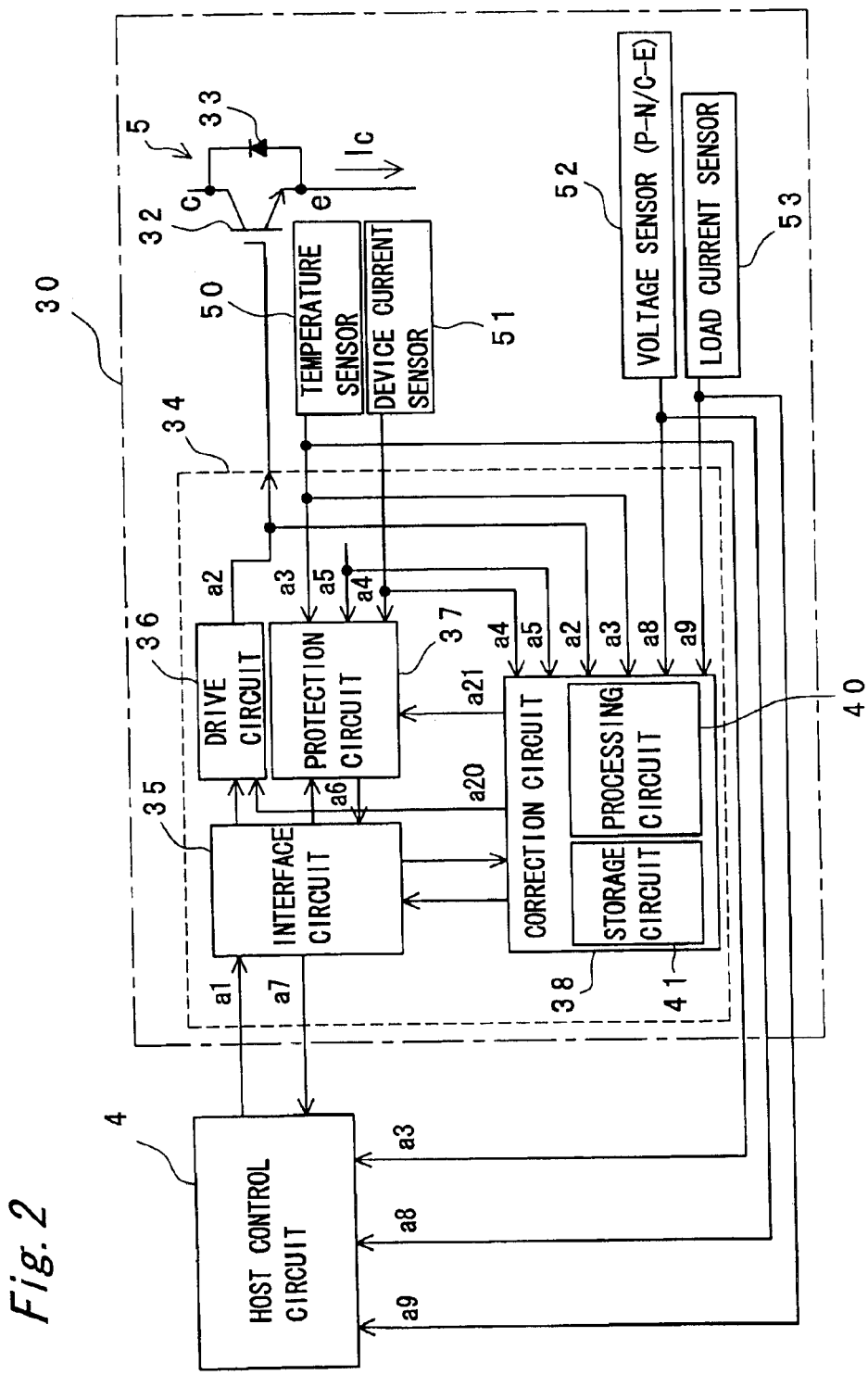
FIG. 2 is a block diagram of a power conversion apparatus according to a first embodiment of the present invention.

FIG. 2 is a block diagram of one of the six IC chips when the power conversion unit 3 shown in FIG. 1 consists of the six IC chips. As shown in FIG. 2, one IC chip (power conversion apparatus) 30 has one power device 5, and a device control circuit 34 which controls the power device 5. The power device 5 is consisted of an IGBT 32 and a FWD 33 connected to each other by back-to-back connection. The device control circuit 34 includes an interface circuit 35 which exchanges signals with the host control circuit 4, a drive circuit 36 which drives the power device 5, a protection circuit 37 which detects an abnormality such as an overvoltage and an overcurrent to protect the power device 5, and a correction circuit 38 which corrects the operations of the drive circuit 36 and the protection circuit 37. The protection circuit 38 includes a processing circuit 40 and a storage circuit (correction storage circuit) 41. In addition, the power conversion apparatus 30 includes a temperature sensor 50 which detects a temperature of the power device 5, an device current sensor 51 which detects an output current of the IGBT 32, a voltage sensor 52 which detects a P-N voltage (refer to FIG. 1) of the power conversion apparatus 30, and a load current sensor 53 which detects an output current (load current) of the power conversion apparatus 30.

An operation of the power conversion apparatus 30 will be described below. The interface circuit 35 obtains a drive signal a1 to make the device control circuit 34 drive the power device 5 from the host control circuit 4. The interface circuit 35 outputs the drive signal a1 to the drive circuit 36. The drive circuit 36 outputs a drive signal a2 (voltage signal) depending on the drive signal a1 to a gate terminal of the IGBT 32. The IGBT 32 operates depending on the drive signal a2.

The temperature sensor 50 detects the temperature of the power device 5. The temperature sensor 50 may be incorporated in the power device 5 or packaged on the IC chip outside the power device 5. The temperature sensor 50 outputs a signal a3 (referred to as a "temperature signal a3") depending on the detected temperature to the protection circuit 37, the correction circuit 38, and the host control circuit 4.

The device current sensor 51 detects the output current $I_C$ of the IGBT 32. The device current sensor 51 may be directly connected to a collector terminal of the IGBT 32 or arranged outside the current path. The device current sensor 51 outputs a signal a4 (referred to as a "device current signal a4") depending on the detected output current $I_C$ to the protection circuit 37 and the correction circuit 38.

The protection circuit 37 obtains the temperature signal a3 output from the temperature sensor 50, the device current signal a4 output from the device current sensor 51, and a signal a5 (referred to as a "power supply voltage signal a5") representing the power supply voltage of the device control circuit 34. The protection circuit 37 compares each value of the obtained signals (a3, a4, and a5) with a corresponding predetermined reference value. When the protection circuit 37 determines as a result of the comparison that the operation of the power device 5 is abnormal, the protection circuit 37 outputs a signal a6 (referred to as an "abnormality signal a6") representing an abnormality to the interface circuit 35. The interface circuit 35 outputs an error signal a7 to the host control circuit 4 when the interface circuit 35 receives the abnormality signal a6 from the protection circuit 37. The host control circuit 4 outputs the drive signal a1 to make the device drive circuit 34 turn off the power device 5, for example, in order to correct the abnormality, when the host control circuit 4 receives the error signal a7. As a result, the power device is protected from breakdown.

The voltage sensor 52 detects the P-N voltage of the power conversion apparatus 30 and outputs a signal a8 (referred to as to a "P-N voltage signal a8") depending on the detected voltage to the correction circuit 38 and the host control circuit 4. The load current sensor 53 detects a load current and outputs a signal a9 (referred to as a "load current signal a9") depending on the load current to the correction circuit 38 and the host control circuit 4. The host control circuit 4 obtains the temperature signal a3 output from the temperature sensor 50, the P-N voltage signal a8 output from the voltage sensor 52, and the load current signal a9 output from the load current sensor 53 to control the motor 2 depending on the values of these input signals (a3, a8, and a9).

The correction circuit 38 obtains the drive signal a2 output from the drive circuit 36, the temperature signal a3 output from the temperature sensor 50, the device current signal a4 output from the device current sensor 51, the power supply voltage signal a5 representing the power supply voltage of the device control circuit 34, the P-N signal a8 output from the voltage sensor 52, and the load current signal a9 output from the load current sensor 53. When the correction circuit 38 receives the signals (a2, a3, a4, a5, a8, and a9), it performs a calculation by using the values of these signals. The correction circuit 38 corrects the value of the output signal (drive signal) a2 of the drive circuit 36, and correct the reference value of the protection circuit 37 based on the result of the calculation. At this time, a signal output to the drive circuit 36 and a signal output to the protection circuit 37 are a correction signal a20 and a correction signal a21, respectively.

Figure 3:
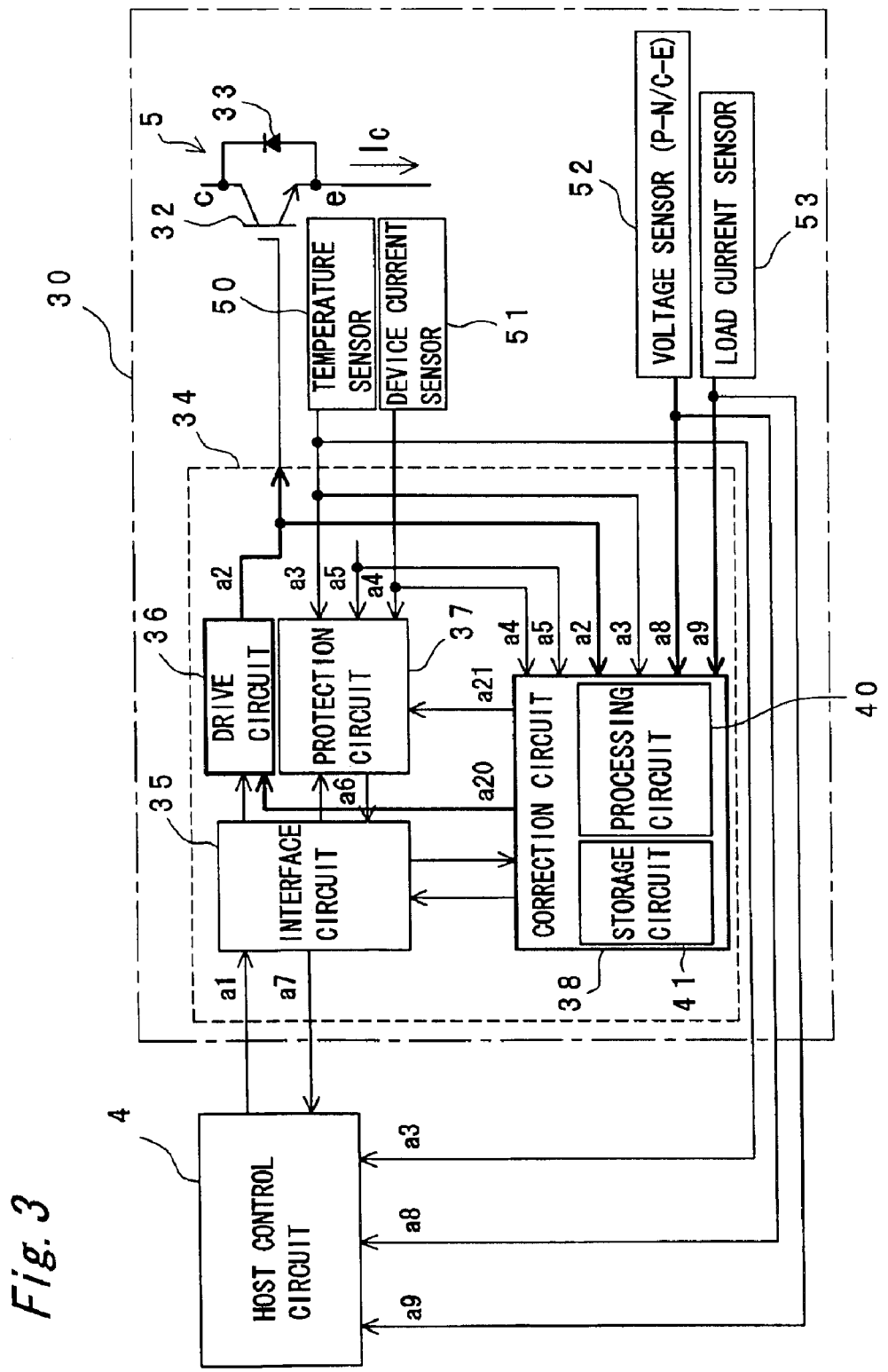
FIG. 3 is a diagram showing a flow of signals in the power conversion apparatus when a drive signal is corrected by a correction circuit.

First, a case will be described below in which the drive signal is corrected by the correction circuit. Hereinafter, the configuration and operation of the drive circuit 36 and them of the correction circuit 38 in the case will be described. As described above, the trade-off is established between a switching loss and a surge voltage. The correction circuit 38 always calculates the switching loss and the surge voltage on the basis of the input signals (that is, the correction circuit 38 always monitors the drive state of the IGBT 32). When at least one of a value of the switching loss and a value of the surge voltage falls outside a predetermined range, the correction circuit 38 corrects the drive signal a2. FIG. 3 is a diagram showing a flow of signals in the power conversion apparatus 30 when the drive signal a2 is corrected by the correction circuit 38. The correction circuit 38 obtains, as input signals, the drive signal a2, a signal a8 representing the value of the P-N voltage of the power conversion apparatus 30 output from the voltage sensor 52, and a signal a9 representing a value of a load current output from the load current sensor 53. The value of the P-N voltage is equal to that of a collector-emitter voltage $V_{CE}$ of the IGBT 32 when the IGBT 32 is in an OFF state. The value of the load current is equal to that of an output current $I_C$ when the IGBT 32 is in an ON state. The correction circuit 38 calculates a switching loss and a surge voltage by using the values of these signals (a2, a8, and a9). When the switching loss and/or the surge voltage fall outside a predetermined range, the correction circuit 38 calculates a correction data for correcting the obtained drive signal a2 such that the switching loss and/or the surge voltage fall within the predetermined range. The correction circuit 38 outputs the correction signal a20 representing the correction data to the drive circuit 36. The drive circuit 36 corrects the drive signal a2 depending on the correction signal a20 and outputs the corrected drive signal a2 to the gate terminal of the IGBT 32.

FIG. 4 is a waveform chart for explaining the drive signal a2 input to the IGBT 32 and an operation of the IGBT 32 when the drive signal a2 is input. In FIG. 4, a waveform (1)

indicates the drive signal a1 output from the host control circuit 4, a waveform (2) indicates the drive signal a2 input to the IGBT 32 when the drive signal a1 shown by the waveform (1) is output from the host control circuit 4. A waveform (3) indicates the output voltage ($V_{CE}$) of the IGBT 32 when the drive signal a2 shown by the waveform (2) is input, and a waveform (4) indicates the output current ($I_C$) of the IGBT 32 when the drive signal a2 shown by the waveform (2) is input. The correction circuit 38 changes the drive signal a2 input to the IGBT 32 temporally (at t1–t3 and at t4–t6) at turning-on and turning-off of the IGBT 32 to optimize the value of the switching loss (shaded area) and the value of the surge voltage ($V_{surge}$).

First, configurations and operations of the drive circuit 36 will be described below. FIG. 5A is a circuit diagram of the drive circuit 36, and FIG. 5B is a circuit diagram of resistors included in the drive circuit 36. As shown in FIG. 5A, the drive circuit 36 includes a drive circuit 202 for gate drive circuits (referred as to a "gate-drive-circuit drive circuit 202", thereinafter), an ON-side gate drive circuit 204, an OFF-side gate drive circuit 206, an N-channel MOSFET 208 connected to the ON-side gate drive circuit 204, an N-channel MOSFET 210 connected to the OFF-side gate drive circuit 206, a resistor 212 connected in series with the N-channel MOSFET 208, and a resistor 214 connected in series with the N-channel MOSFET 210. The gate-drive-circuit drive circuit 202 includes a resistance control circuit 216 which changes the resistances of the resistor 212 and the resistor 214. The N-channel MOSFET 208 has a gate terminal (G), a source terminal (S), and a drain terminal (D) which are connected to the ON-side gate drive circuit 204, the resistor 212, and a power supply Vcc, respectively. The N-channel MOSFET 210 has a gate terminal (G) and a drain terminal (D) which are connected to the OFF-side gate drive circuit 206 and the resistor 214, respectively, and has a source terminal (S) which is grounded. Resistors 212, 214 are connected to the gate terminal of the IGBT 32.

The drive signal a1 and the correction signal a20 are input to the gate-drive-circuit drive circuit 202. When the gate-drive-circuit drive circuit 202 receives the drive signal a1 to make the drive circuit 36 turn on the IGBT 32, the gate-drive-circuit drive circuit 202 outputs a signal to make the ON-side gate drive circuit 204 start its operation, and a signal to make the OFF-side gate drive circuit 206 stop its operation. While, when the gate-drive-circuit drive circuit 202 receives the drive signal a1 to make the drive circuit 36 turn off the IGBT 32, the gate-drive-circuit drive circuit 202 outputs a signal to the ON-side gate drive circuit 204 stop its operation, and a signal to make the OFF-side gate drive circuit 206 start its operation. When the ON-side gate drive circuit 204 receives a signal to make it start its operation from the gate-drive-circuit drive circuit 202, the ON-side gate drive circuit 204 generates a voltage signal by using a voltage signal a30 output from the power supply Vcc. And the ON-side gate drive circuit 204 outputs the voltage signal to the gate terminal of MOSFET 208. When the OFF-side gate drive circuit 206 receives a signal to make it start its operation from the gate-drive-circuit drive circuit 202, the OFF-side gate drive circuit 206 generates a voltage signal by using a voltage signal a30 output from the power supply Vcc. And the OFF-side gate drive circuit 206 outputs the voltage signal to the gate terminal of MOSFET 210. Each of the MOSFET 208 and the MOSFET 210 is turned on when the voltage signal is input to each gate terminal of them. As a result, when the MOSFET 208 is turned on, a current flows from the source terminal of the MOSFET 208 to the gate terminal of the IGBT 32 through the resistor 212 to turn on the IGBT 32. On the other hand, when the MOSFET 210 is turned on, a current flows from the gate terminal of the IGBT 32 to the drain terminal of the MOSFET 210 through the resistor 214 to turn off the IGBT 32.

FIG. 5B shows a configuration of the resistor 212. The resistor 212 is consisted of a plurality of sets of a resistor and a switch, which are connected in parallel to each other. A total resistance of the resistor 212 is changed depending on how many switch of the resistor 212 is on. This configuration is also applied to the resistor 214. When the resistance control circuit 216 receives the correction signal a20, the resistance control circuit 216 outputs a signal a32 for switching on or off each of the switches of the resistor 212 or the resistor 214 depending on the correction signal a 20. For example, when the drive signal a1 and the correction signal a20 are input to the gate-drive-circuit drive circuit 202, and the drive signal a1 makes the drive circuit 36 turn off the IGBT 32, the resistance control circuit 216 outputs the signal a32 for turning on or off each of the switches of the resistor 214 depending on the correction signal a20.

As described above, a rate of a change of a gate voltage applied to the IGBT 32 can be changed by changing the resistance of the resistor 212 at turning on the IGBT 32, and by changing the resistance of the resistor 214 at turning off the IGBT 32.

Figure 6:
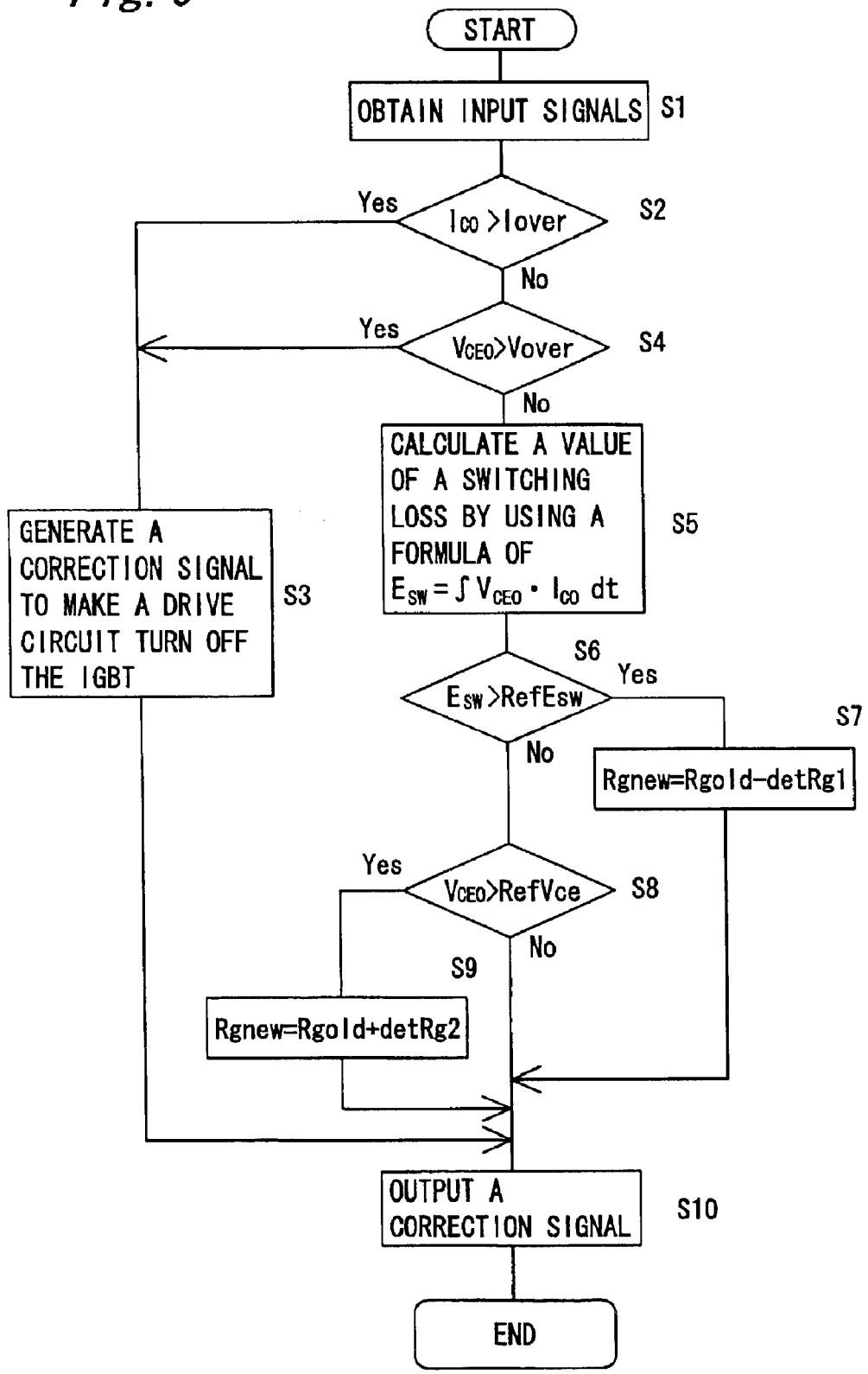
FIG. 6 is a flow chart showing an operation of a correction circuit.

Next, an operation of the correction circuit 38 will be described below. In the power conversion apparatus 30 according to this embodiment, the correction circuit 38 always monitors an output voltage and an output current of the IGBT 32, and controls the drive signal a2 output to the IGBT 32 such that the switching loss and the surge voltage of the IGBT 32 fall within a predetermined range. The correction circuit 38 is controlled by a host control circuit 4. FIG. 6 is a flow chart of control process by the host control circuit 4 in a correction process. The host control circuit 4 makes the correction circuit 38 obtain the input signals (step S1), and then to compare the value (shown by $I_{CO}$ in FIG. 6) of the signal a9 with a set value $I_{over}$ to decide whether an overcurrent occurs in the IGBT 32 (step S2). When the value $I_{CO}$ is larger than the set value $I_{over}$, the host control circuit 4 makes the correction circuit 38 generate a correction signal to protect the IGBT 32, for example, a correction signal to make the drive circuit 36 turn off the IGBT 32 (step S3). When the value $I_{CO}$ is not larger than the set value $I_{over}$, the correction process shifts to the next step in which the host control circuit 4 makes the correction circuit 38 compare the value (shown by $V_{CEO}$ in FIG. 6) of the signal a8 with a set value $V_{over}$ to decide whether an overvoltage occurs in the IGBT 32 (step S4). When the value $V_{CEO}$ is larger than the value $V_{over}$, the host control circuit 4 makes the correction circuit 38 generate a correction signal to protect the IGBT 32, for example, a correction signal to make the drive circuit 36 turn off the IGBT 32 (step S3). When the value $V_{CEO}$ is not larger than the value $V_{over}$, the correction process shifts to the next step in which the host control circuit 4 makes the correction circuit 38 calculate a switching loss (step S5). At this time, the correction circuit 38 calculates the switching loss by using the following equation (2).

$$E_{SW} = \int V_{CEO} \times I_{CO} dt \qquad (2)$$

Then, the host control circuit 4 makes the correction circuit 38 compare the value $E_{SW}$ calculated in step S5 with a value of a reference switching loss (to be referred to as a "loss reference value $RefE_{SW}$" hereinafter) (step S6). When the value $E_{SW}$ is larger than the loss reference value $RefE_{SW}$, the host control circuit 4 makes the correction circuit 38 calculate a new gate resistance value of the IGBT 32 (a resistance value of the resistor 212 or a resistance value of the resistor 214 in FIG. 5) arranged in the drive circuit 36 such that the value $E_{SW}$ is not larger than the loss reference value RefE$_{SW}$ (step S7). The new resistance value is output to the drive circuit 36 as a correction signal. More specifically, the new gate resistance value Rg$_{new}$ is expressed by an equation (3) by using a gate resistance value which has been used up to now Rg$_{old}$ and a predetermined gate resistance change value detRg1. In this case, in order to reduce the switching loss of the IGBT 32, the new gate resistance value Rg$_{new}$ is set to be smaller than the gate resistance value Rg$_{old}$ which has been used up to now.

$$Rg_{new} = Rg_{old} - detRg1 \quad (3)$$

When the value $E_{SW}$ is not larger than the loss reference value RefE$_{SW}$, the correction process shifts to the next step S8. In step S8, the host control circuit 4 makes the correction circuit 38 compare the value $V_{CEO}$ with a reference surge voltage (to be referred to as a "surge voltage reference value RefV$_{CE}$" hereinafter) (step S8). When the value $V_{CEO}$ is larger than the surge voltage reference value RefV$_{CE}$, the host control circuit 4 makes the correction circuit 38 determine the value $V_{CEO}$ as a surge voltage, and makes the correction circuit 38 calculate a new gate resistance value of the IGBT 32 arranged in the drive circuit 36 such that the value $V_{CEO}$ is not larger than the surge voltage reference value RefV$_{CE}$ (step S9). The new resistance value is output to the drive circuit 36 as a correction signal. More specifically, the new gate resistance Rg$_{new}$ is expressed by an equation (4) by using the gate resistance value which has been used up to now Rg$_{old}$, and the gate resistance change value detRg2. In this case, the new gate resistance value Rg$_{new}$ is set to be smaller than the gate resistance value Rg$_{old}$, in order to suppress the surge voltage of the IGBT 32.

$$Rg_{new} = Rg_{old} + detRg2 \quad (4)$$

Then, the host control circuit 4 makes the correction circuit 38 output a correction signal a20 (step S10).

The value $I_{over}$, the value $V_{over}$, the loss reference value RefE$_{SW}$, and the surge voltage reference value RefV$_{CE}$ are stored in the storage circuit 41 in the correction circuit 38.

The correction signal a20 output from the protection circuit 38 is input to the drive circuit 36. When the drive circuit 36 receives the correction signal a20 representing the new resistance value, the drive circuit 36 changes the resistance value of the resistor 212 or the resistor 214 such that the gate resistance of the IGBT 32 is equal to the new resistance value. When the correction signal a20 input to the drive circuit 36 makes the drive circuit 36 turn off the IGBT, the gate-drive-circuit drive circuit 202 outputs a signal to make the ON-side gate drive circuit 204 stop its operation, and a signal to make the OFF-side gate drive circuit 206 start its operation for a predetermined period of time. As a result, the IGBT 32 is turned off.

In the power conversion apparatus according to this embodiment, when the drive signal a2 is corrected by the correction circuit 38, the correction circuit 38 performs the correction process (steps S1–S10 as shown in FIG. 6) such that the correction is immediately reflected on the drive signal a2. More specifically, the correction circuit 38 generates the correction signal a20 on the basis of signals input at a leading edge of the drive signal a2, and outputs it to the drive circuit 36 at the same leading edge of the drive signal a2. And, the correction circuit 38 generates the correction signal a20 on the basis of signals input at a trailing edge of the drive signal a2, and outputs it to the drive circuit 36 at the same trailing edge of the drive signal a2.

Figure 7:
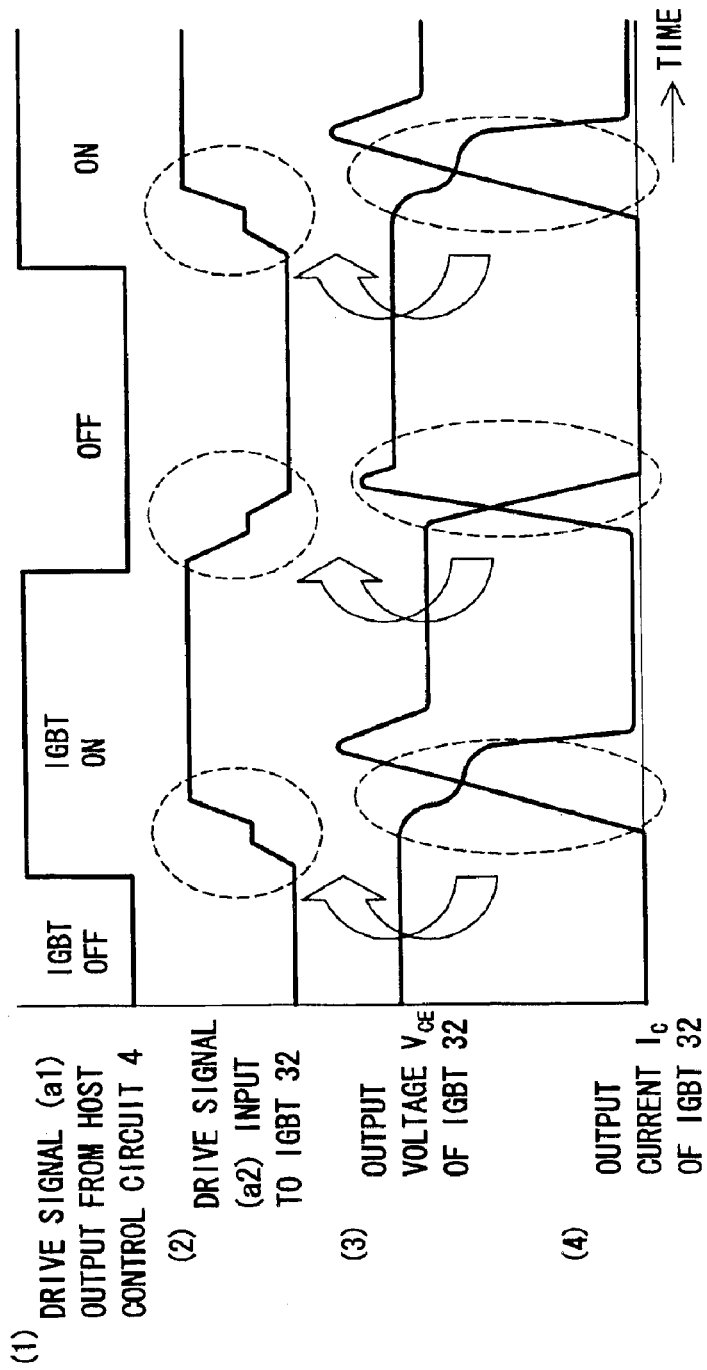
FIG. 7 is a waveform chart for explaining an operation of the correction circuit according to the first embodiment of the present invention.

FIG. 7 is a waveform chart for explaining a real-time correction process. In general, a transition time of the drive signal a2 from the ON state to the OFF state or from the OFF state to the ON state, that is a switching time, is 1 μm or less. Thus, a propagation delay time of the device control circuit 34 must be several tens of nano seconds after signals are output from the voltage sensor 52 and the load current sensor 53 until the gate drive signal a2 is output.

In the power conversion apparatus according to this embodiment, the correction circuit always monitors an output voltage and an output current of the switching device, and controls a drive signal such that the values of the switching loss and the surge voltage of the switching device are always set within a predetermined range. Therefore, the values of the switching loss and the surge voltage can be always set at appropriate values with high accuracy. As a result, the characteristics of the power conversion apparatus can be prevented from being deteriorated by variations of these values.

Figure 8:
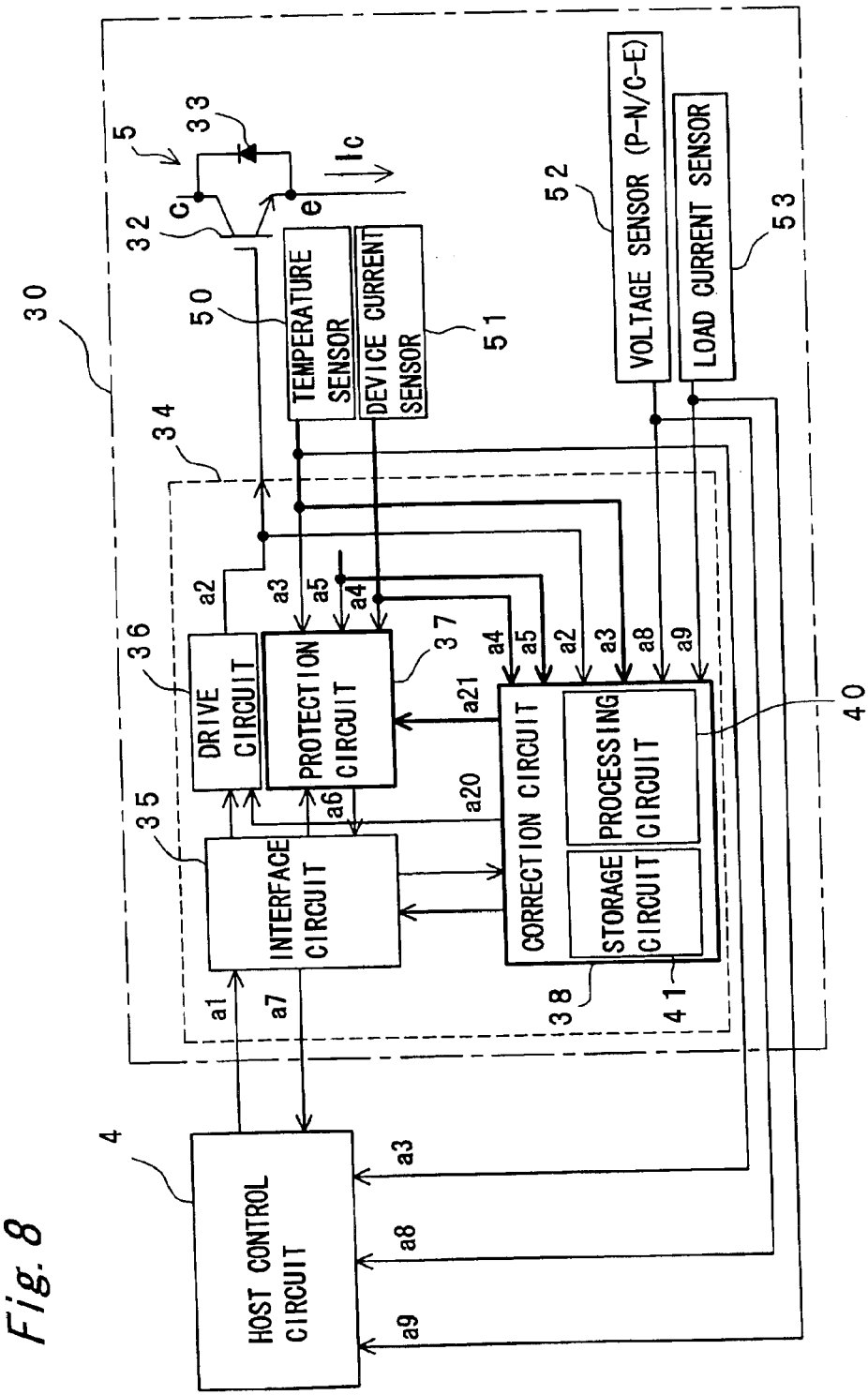
FIG. 8 is a diagram showing a flow of signals in the power conversion apparatus when a reference value in a protection circuit is corrected by the correction circuit.

Next, a case will be described below in which the reference value in the protection circuit 37 is corrected. Hereinafter, the configurations and operations of the protection circuit 37 and the correction circuit 38 in the case will be described. FIG. 8 is a diagram showing a flow of signals in the power conversion apparatus 30 when the reference value in the protection circuit 37 is corrected by the correction circuit 38. The correction circuit 38 obtains, as input signals, a temperature signal a3 representing the temperature of the power device 5 output from the temperature sensor 50, the device current signal a4 representing an output signal of the IGBT 32 output from the device current sensor 51, and a power supply voltage signal a5 representing the power supply voltage of the device control circuit 34. The correction circuit 38 sets a correction reference value for each of the obtained signals (a3, a4, and a5), and outputs a correction signal a21 representing the correction reference value (correction data). The correction signal a21 is input to the protection circuit 37. The protection circuit 37 compares each value of the input signals (a3, a4, and a5) with each corresponding correction reference value represented by the correction signal a21.

Figure 9:
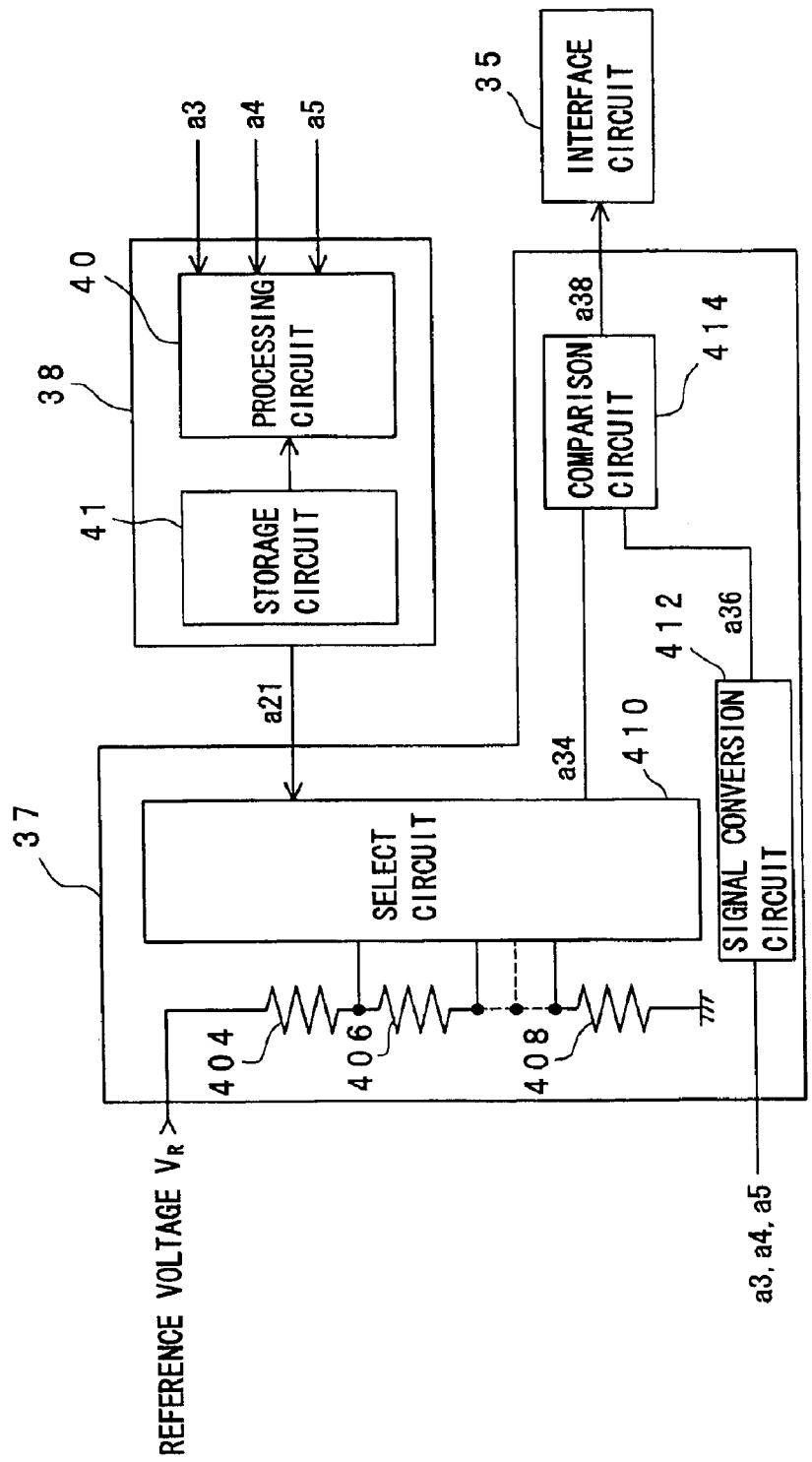
FIG. 9 is a block diagram of the protection circuit and the correction circuit.

FIG. 9 is a block diagram of the protection circuit 37 and the correction circuit 38. As shown in FIG. 9, the protection circuit 37 includes resistors 404, 406, and 408 which divide a reference voltage $V_R$, a select circuit 410 which can generate any voltage by selecting one or more of the resistors, a signal conversion circuit 412 which converts the signals (a3, a4, and a5) input from the various sensors into voltage signals, and a comparison circuit 414 which compares the value (reference value) of the voltage generated by the select circuit 410 with the value of an output signal of the signal conversion circuit 412. The correction circuit 38 includes a correction processing circuit 40 and a storage circuit 41.

A correction of a variation of a protection level by the correction circuit 38 will be described below. In this case, the variation is caused by a change in temperature. The storage circuit 41 stores the first reference values to be compared with the temperature signals a4, and the second reference values to be compared with the power supply signal a5 for various temperatures. The first reference values correspond to the protection levels of output currents of an IGBT 31 under various temperature conditions. The second reference values correspond to the protection levels of power supply voltages of the device control circuit 34 under various temperature conditions. The first reference values can be calculated on the basis of the values of the signals a4 output from the device current sensor 51 when the power conversion apparatus 30 is operated under the various temperature conditions in a test before shipping. Also, the second reference values are calculated on the basis of the values of the power supply voltage signals a5 output from the device control circuit 34 when the power conversion apparatus 30 is operated under the various temperature conditions in the test before shipping.

The operations of the protection circuit 37 and the correction circuit 38 will be described below. First, a correction of the reference voltage of the protection circuit 37 on the basis of the output signal of the device current sensor 51 will be described below. When the correction processing circuit 40 of the correction circuit 38 receives the temperature signal a3 and the device current signal a4, it detects a temperature by using the temperature signal a3. Then, the correction processing circuit 40 locate a correction reference value to be compared with the device current signal a5 at the temperature in the storage circuit 41, and outputs the correction signal a21 representing the correction reference value (correction data) to the protection circuit 37.

The correction signal a21 is input to the select circuit 410 of the protection circuit 37. The select circuit 410 selects one or more resistors such that the value (reference value) of the voltage generated by the reference voltage $V_R$ and the selected resistors is equal to the correction reference value represented by the correction signal a21. A signal a34 representing the reference value of the voltage generated by the select circuit 410 is input to the comparison circuit 414.

The output signal a4 of the device current sensor 51 is input to the comparison circuit 414. The signal a4 is converted into a voltage signal a36 by the signal conversion circuit 412 if necessary (if the signal a4 is not a voltage signal). The comparison circuit 414 compares the value of the voltage signal a36 with the value of the voltage signal a34. The comparison circuit 414 outputs a signal a38 on the basis of the comparison result. The signal a38 is an abnormality signal representing that the IGBT 32 is abnormal to the interface circuit 35 when the value of the voltage signal a36 exceeds the reference value. The comparison circuit 414 may output the abnormality signal when the value of the voltage signal a36 is smaller than the value of the voltage signal a34 depending on the kind of the detected state In the protection circuit 37 shown in FIG. 9, when the signal a4 output from the device current sensor 51 is originally a voltage signal, the signal conversion circuit 412 can be omitted.

The correction process described above can also be applied to the correction of the reference voltage of the protection circuit 37 on the basis of the signal a5 representing the power supply voltage of the device control circuit 34. When the correction processing circuit 40 receives the power supply voltage signal a5, it detects a temperature by using the temperature signal a3 output from the temperature sensor 50, and locates a correction reference value which is to be compared with the signal a5 at the temperature in the correction storage circuit 41. Then, the correction circuit 38 outputs the correction signal a21 representing the correction reference value (correction data) to the protection circuit 37. The description of the protection circuit 37 will be omitted since the description is the same as that for the output signal a4 described above. The signal conversion circuit 412 in the protection circuit 37 can be omitted since the signal a5 representing the power supply voltage of the device control circuit is generally a voltage signal.

According to the power conversion apparatus of this embodiment, the reference values to be compared with the output current of the IGBT 32 and the power supply voltage of the device control circuit 34 can be corrected in accordance with the variation even though the protection level of the output current of the IGBT 32 and that of the power supply voltage of the device control circuit 34 vary depending on a change in temperature. Therefore, the characteristics of the power conversion apparatus can be prevented from being deteriorated.

According to the power conversion apparatus of this embodiment, when the reference value in the protection circuit 37 is corrected by the correction circuit 38, the corrected reference value is fed back to the protection circuit 37 at a high speed. In this case, a propagation delay time of the device control circuit 34 may be several tens of nano seconds after the temperature signal a3, the device current signal a4, and the power supply voltage signal a5 are output, and the correction process is performed by the correction circuit 38 until the correction signal a21 is output to the protection circuit 37. The correction circuit 38 generates the correction signal a21 on the basis of a signal input at a leading edge of the drive signal a2, and outputs the correction signal a21 to the protection circuit 37 at the same leading edge of the drive signal a2. The correction circuit 38 generates the correction signal a21 on the basis of a signal input at a trailing edge of the drive signal a2, and outputs the correction signal a21 to the protection circuit 37 at the same trailing edge of the drive signal a2.

The protection circuit 37 includes a comparator to compare the each value of signals representing a temperature and an output voltage of a device with the corresponding reference value, which determines that the device operates abnormally, and outputs an abnormality signal when the value of the signal is larger than the reference value (or the value of the signal is smaller than the reference value). According to the power conversion apparatus of this embodiment, its protection function is maintained even though the characteristics of any component of the power conversion apparatus change depending on a change in temperature, aging, or the like, since the protection circuit sets an appropriate reference value each time a comparing operation is performed therein. More specifically, no abnormality signal is output with reference to the IGBT which normally operates.

In the power conversion apparatus according to this embodiment, the correction circuit always monitors the drive state of the switching device or the power supply voltage of the device control circuit to always correct the variations of protection levels caused by a change in temperature with high accuracy. Thus, the characteristics of the power conversion apparatus can be prevented from being deteriorated by the deterioration of the protection function. In addition, the power conversion apparatus can cope with a rapid change in temperature or a rapid change in a voltage (that is, surge voltage) since a time required for a feedback operation performed from the correction circuit to the drive circuit and the protection circuit is short.

In the power conversion apparatus according to this embodiment, the protection circuit detects the temperature and the output current of the switching device, and the power supply voltage of the device control circuit. However, the protection circuit may detect other characteristics of the switching device. For example, the protection circuit may detect an output voltage of the switching device.

The correction circuit 38 can detect an output voltage of IGBT 32 (collector-emitter voltage $V_{CE}$ of the IGBT 32) on the basis of the output signal a8 of the voltage sensor 52. The correction circuit 38 can correct a variation of a protection level caused by aging on the basis of the output signal a8 of the voltage sensor 52 and the output signal a4 of the device current sensor 51. This operation will be described below. In the correction storage circuit 41, the output voltage characteristic of the IGBT 5 and the switching loss characteristic of the IGBT 5 are stored such that these characteristics are related to each other. These characteristics can be obtained by detecting the output signal a4 of the device current sensor 51 (that is, output current of the IGBT 5) and the output signal a8 of the voltage sensor 52 (that is, output voltage of the power device 5), and calculating a switching loss by using the values of detected signals by the correction processing circuit 40 while operating the power conversion apparatus 30 for a predetermined period of time in a test before shipping.

In an actual operation of the power conversion apparatus, the correction circuit 38 detects the signal a4 from the device current sensor 51 and the signal a8 from the voltage sensor 52, and calculates the switching loss by using the values of the signals by the correction processing circuit 40 (refer to equation (2)). Then, the correction circuit 38 stores the values of the signals a4, a8 and the corresponding switching loss in the correction storage circuit 41. After the operation described above is repeated several times (after a set period of time), a plurality of data are stored with respect to the values of the signals a4 and a8 and the switching loss, and actually detected data is compared with the data stored in the correction storage circuit 41. When a range of the switching loss to a voltage range is larger in the actually detected data than that in the data stored in the correction storage circuit 41, a protection level related to the output voltage of the IGBT 32 is corrected. While, when a range of the switching loss to a current range is larger than that in the actually detected data than in the data stored in the correction storage circuit 41, a protection level related to the output current of the IGBT 32 is corrected. More specifically, that the protection level is corrected means that the protection level is raised (the reference value is increased). When the range of the switching loss in the actually detected data is larger than a predetermined range, it is considered that the switching loss is abnormal, and the correction process is stopped.

In the power conversion apparatus according to this embodiment, the correction circuit always monitors the drive state of the switching device, and always corrects a variation in protection level caused by aging with high accuracy. Thus, the characteristics of the power conversion apparatus can be prevented from being deteriorated by the deterioration of the protection function. In addition, the power conversion apparatus can cope with a rapid change in temperature or a rapid change in a voltage (that is, surge voltage) since a time required for a feedback from the correction circuit to the drive circuit and the protection circuit is short.

The correction storage circuit 41 may be an EEPROM (electrically-erasable programmble read only memory). The contents stored in the EEPROM can be arbitrarily rewritten in the operation of the power conversion apparatus because the contents stored in the EEPROM can be rewritten any number of times. The correction storage circuit 41 may be an EPROM (erasable PROM), a SRAM (static random-access memory), or a flip-flop. In the case that the correction storage circuit 41 is one of them, the power conversion apparatus can be constituted at a lower cost. The correction reference value can also be stored by zener zap trimming. In this case, the power conversion apparatus can be constituted at lower cost than the case that it is stored by using the EPROM, the SRAM, and the flip-flop. In addition, the correction reference value may be stored by using laser trimming method. In this case, the power conversion apparatus can be constituted at lower cost than the case that it is stored by using the EEPROM. Further, in the case that the correction reference value is stored by using laser trimming method, the power conversion apparatus is stronger to noise than in the case that the correction reference value is stored by using the EEPROM, the SRAM, and the flip-flop. Further, in the case that the correction reference value is stored by laser trimming, the power conversion apparatus is more accurate than in the case that the correction reference value is stored by zener zap trimming. Further, the correction reference value may be stored by connecting to each other or disconnecting from each other each bonding wire pad in the ICs and each lead frame on which the ICs are mounted by a bonding wire. In this case, connecting or disconnecting plays a role as a 1-bit storage element. In this case, the power conversion apparatus can be constituted at lower cost.

Figure 10:
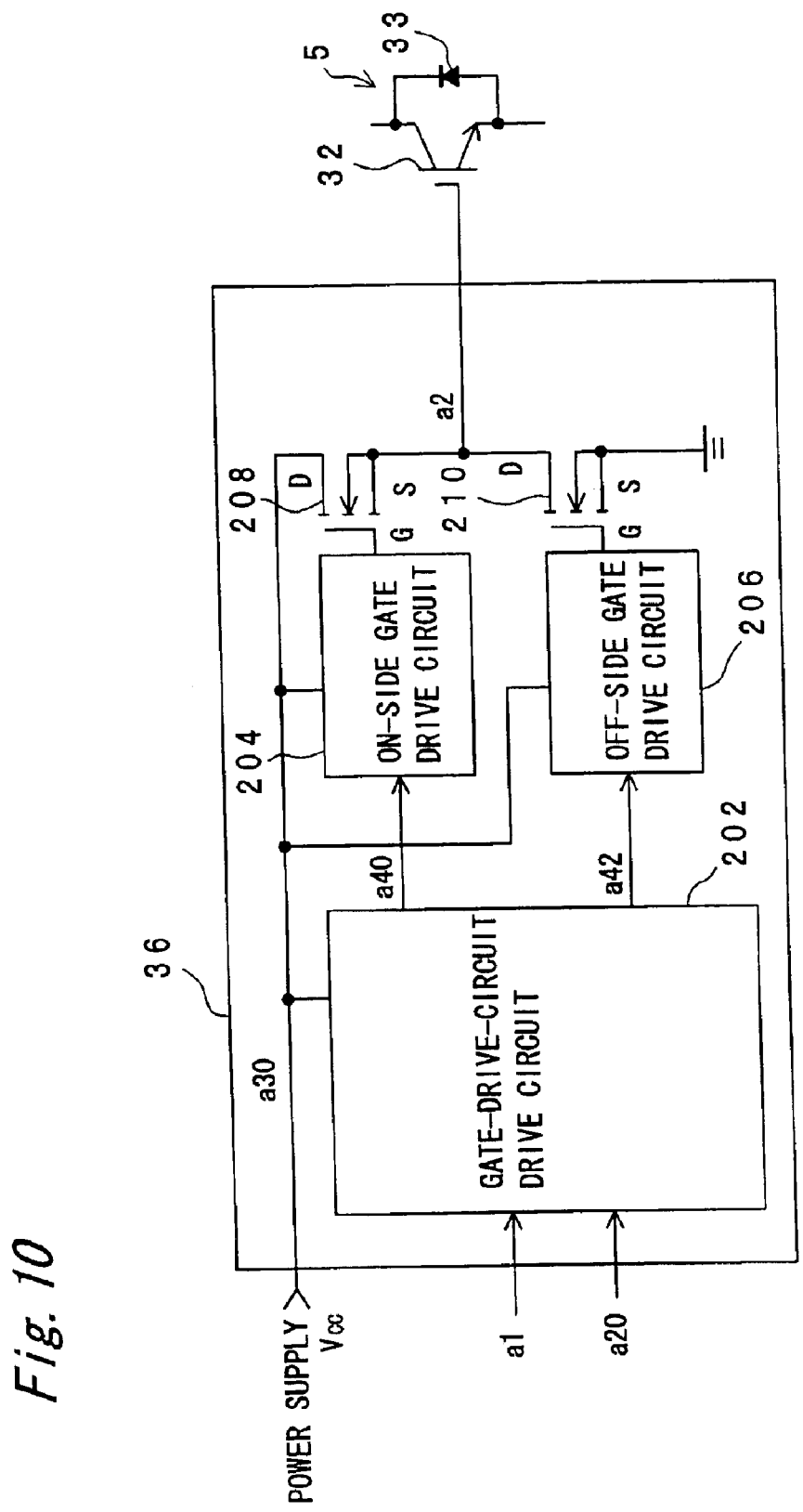
FIG. 10 is a diagram of a drive circuit having MOSFETs.

In the power conversion apparatus according to this embodiment, a voltage applied to the gate terminal of the IGBT 32 is adjusted by changing the value of the resistors connected to gate terminal thereof. However, alternatively, the voltage may be adjusted by using the ON-resistance of a MOSFET. FIG. 10 is a diagram of the drive circuit 36 in this case. As shown in FIG. 10, the drive circuit 36 includes the gate-drive-circuit drive circuit 202, the ON-side gate drive circuit 204, the OFF-side gate drive circuit 206, the N-channel MOSFET 208 connected to the ON-side gate drive circuit 204, and the N-channel MOSFET 210 connected to the OFF-side gate drive circuit 206. This configuration is different from the configuration of the drive circuit 36 shown in FIG. 5 in that resistors 212, 214 connected to the gate of the IGBT 32 and a resistance control circuit 216 are removed. The other components and connections thereof are the same as those in the drive circuit 36 shown in FIG. 5.

The operation of the drive circuit 36 shown in FIG. 10 will be described below. The drive signal a1 and the correction signal a20 are input to the gate-drive-circuit drive circuit 202. The operation of the gate-drive-circuit 202 when the drive signal a1 is input to it is the same as that of the gate-drive-circuit drive circuit 202 in the drive circuit 36 shown in FIG. 5. While, the gate-drive-circuit drive circuit 202 outputs a signal a40 representing a voltage to be applied to the MOSFET 208 to the ON-side gate drive circuit 204 and outputs a signal a42 representing a voltage to be applied to the MOSFET 206 to the OFF-side gate drive circuit 206, when the correction signal a20 is input to it. For example, when the drive signal a1 and the correction signal a20 are input to the gate-drive-circuit drive circuit 202, and, at the same time, when the drive signal a1 makes the drive circuit 36 turn off the IGBT 32, the gate-drive-circuit drive circuit 202 outputs a signal a42 representing a voltage to be applied to the gate terminal of the MOSFET 210 by the OFF-side gate drive circuit 206 depending on the correction signal a20 to the OFF-side gate drive circuit 206. The OFF-side gate drive circuit 206 applies the voltage represented by the signal a42 to the gate terminal of the N-channel MOSFET 210.

In the drive circuit 36 in FIG. 10, the output current of the MOSFET 208 and that of MOSFET 210 change depending on the voltage applied to the gate terminal of the MOSFET 208 and that of the MOSFET 210, respectively. Therefore, when the voltages applied to the gate terminals of MOSFETs 208 and 210 are changed, currents flowing into or from the gate terminal of the IGBT 32 can be changed. Thus, when the ON-resistances of the MOSFETs 208 and 210 are changed as described above, a rate of a change of the gate voltage applied to the IGBT 32 can be changed.

As described above, when the ON-resistance of the MOSFET is used in place of the resistance of the resistors connected to the gate terminal of the IGBT, the resistor which is often a discrete part can be eliminated, and therefore the reduction of the number of circuit components and the integration of the circuits can be realized.

When the ON-resistance of the MOSFET is used in place of the resistance of the resistor, value of the ON-resistance corresponds to the resistance value in the flow chart shown in FIG. 6. In this case, the gate-drive-circuit drive circuit 202 calculates a voltage applied to the MOSFET by using the relationship of the gate voltage and the output current of the MOSFET such that the value of the ON-resistance of the MOSFET corresponds to the value of the resistance represented by the correction signal a20. This calculation may be performed by the correction circuit 38 in advance. In this case, the voltage applied to the MOSFET may be output from the correction circuit 38 to the drive circuit 36 as the correction signal a20.

Figure 11:
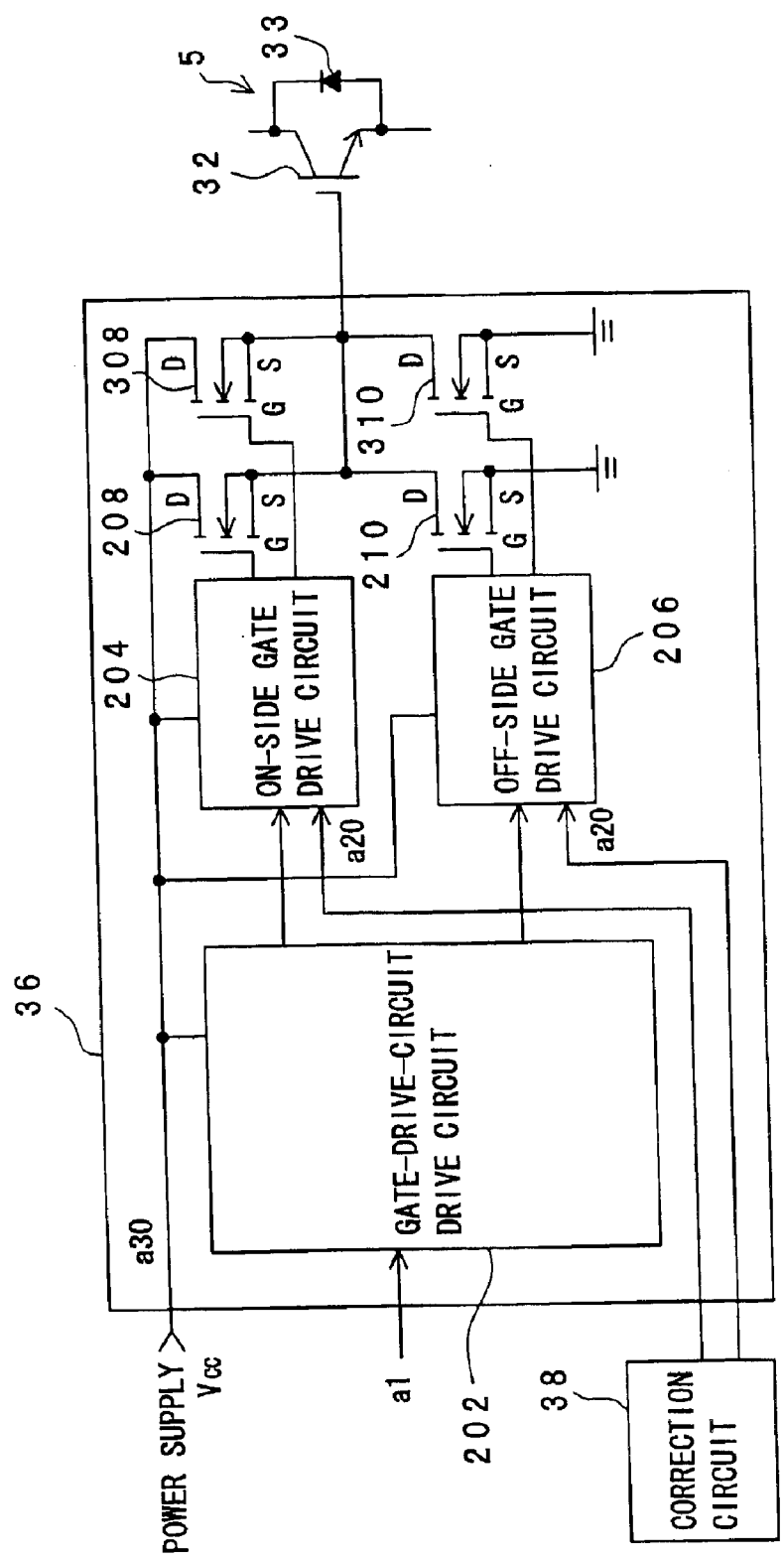
FIG. 11 is a diagram of a drive circuit having a plurality of MOSFETs which are connected in parallel to each other.

Further, a voltage applied to the gate terminal of the IGBT 32 may be adjusted by using the ON-resistances of a plurality of MOSFETs connected in parallel to the gate terminal of the IGBT 32. FIG. 11 is a diagram of the drive circuit 36 in such a case. The drive circuit shown in FIG. 11 is different from that shown in FIG. 10 in that a N-channel MOSFET 308 is connected to the N-channel MOSFET 208 in parallel to each other, and an N-channel MOSFET 310 is connected to the N-channel MOSFET 210 in parallel to each other. A description of the other components and the connections thereof will be omitted because they are the same as those in the drive circuit shown in FIG. 10.

In the drive circuit 36 shown in FIG. 11, the correction signals a20 output from the correction circuit 38 are directly input to the ON-side gate drive circuit 204 and the OFF-side gate drive circuit 206 without passing through the gate-drive-circuit drive circuit 202. Each of the ON-side gate drive circuit 204 and the OFF-side gate drive circuit 206 determines the number of MOSFETs to be turned on based on the correction signals a20, and then turns on one or two MOSFETs, if needed. The correction signal a20 representing the number of MOSFETs to be turned on by the ON-side gate drive circuit 204 and that representing the number of MOSFETs to be turned on by the OFF-side gate drive circuit 206 may be input from the correction circuit 38 to the ON-side gate drive circuit 204 and the OFF-side gate drive circuit 206, respectively. In this case, each of the ON-side gate drive circuit 204 and the OFF-side gate drive circuit 206 applies a gate voltage to the MOSFETs the numbers of which are represented by the correction signal a20 when the correction signal a20 is input to them.

According to the drive circuit 36 shown in FIG. 11, current flowing into or from the gate terminal of the IGBT 32 can be changed by changing the number of MOSFETs to be turned on. Thus, a rate of a change of a gate voltage applied to the IGBT 32 can be changed.

According to the drive circuit 36 shown in FIG. 11, the correction signals a20 output from the correction circuit 38 are directly input to the ON-side gate drive circuit 204 and the OFF-side gate drive circuit 206 without passing through the gate-drive-circuit drive circuit 202. Thus, the ON-resistances can be exactly and accurately adjusted.

In addition, according to the drive circuit 36 shown in FIG. 11, the number of components of circuit can be reduced, and the circuits can be integrated.

In the drive circuit 36 shown in FIG. 11, the number of MOSFETs connected in parallel to each other may be any number which is two or more. Further, the MOSFETs may have different or the same characteristics. In addition, when the characteristics of the MOSFETs connected in parallel to each other are different from each other due to a difference of sizes, the correction signal a20 may not represent the number of MOSFETs to be turned on but represent which MOSFET is to be turned on.

Further, a voltage ($V_{SD}$) between the source (S) and the drain (D) of the MOSFET may be variable depending on a correction signal output from the correction circuit. In this case, the ON-resistance of the MOSFET can be more exactly adjusted. As a result, the ON-resistance can be adjusted at higher accuracy.

Although a transistor used in a drive circuit is a MOSFET in the power conversion apparatus according to this embodiment, the transistor is not limited to the MOSFET. Alternatively, another transistor including a bipolar transistor may be used. Even in that case, the same effect as that in the power conversion apparatus of this embodiment can be obtained as long as an output current from the transistor can be changed depending on the value of a signal input to the transistor.

Figure 12:
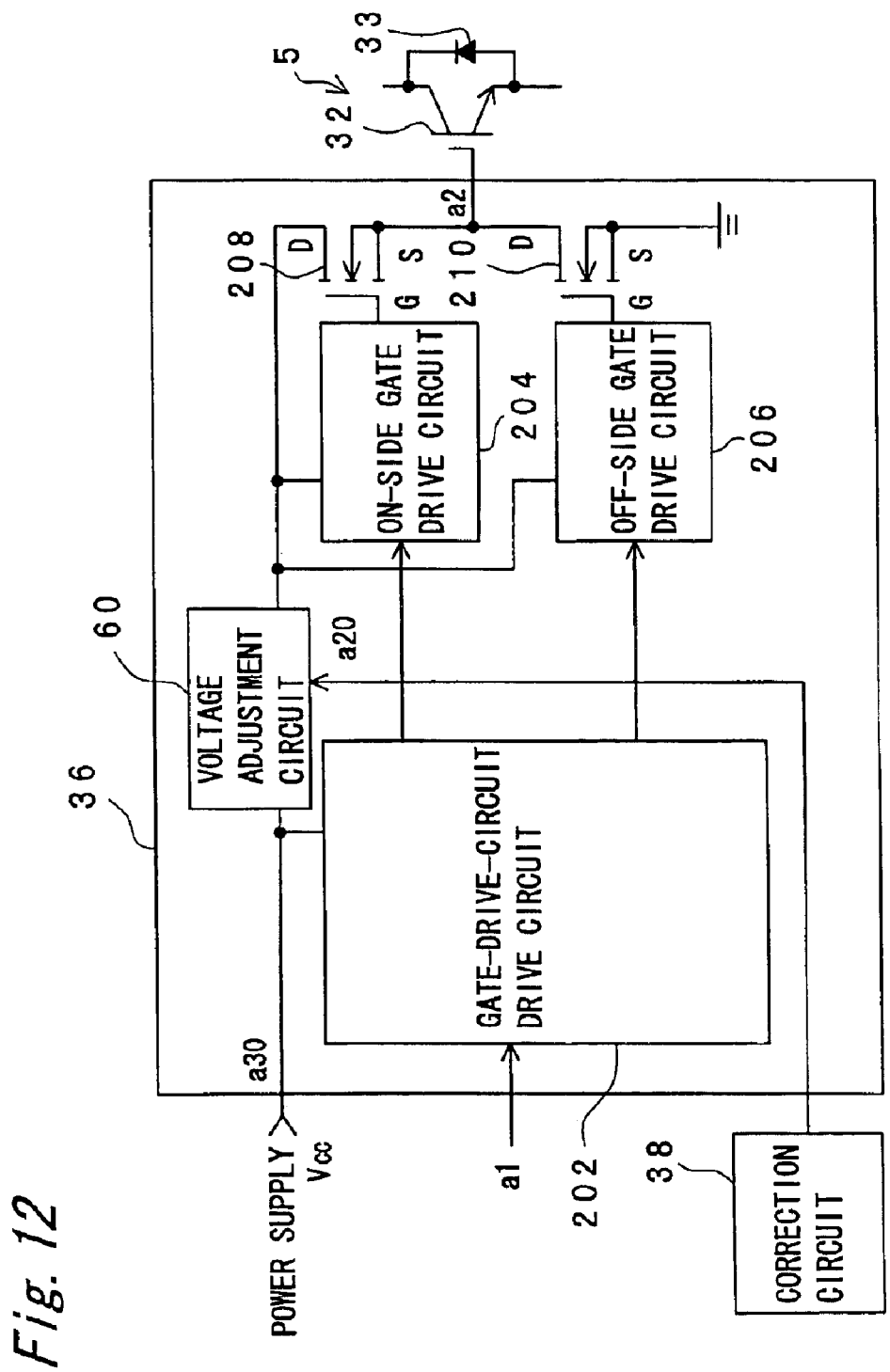
FIG. 12 is a diagram of a drive circuit having a voltage adjustment circuit.

In the drive circuits 36 shown in FIG. 10 and FIG. 11, the gate-drive-circuit drive circuit 202 or the ON-side gate drive circuits 204 and 206 are controlled by the correction signal a20. However, as shown in FIG. 12, a voltage adjustment circuit 60 is arranged between the power supply Vcc and the ON-side gate drive circuit 204 (OFF-side gate drive circuit 206), and the voltage adjustment circuit 60 may be controlled by the correction signal a20. The voltage adjustment circuit 60 changes a voltage output from the power supply Vcc. As a result, the voltage adjustment circuit 60 can change a gate voltage applied to the MOSFET and a source-drain voltage of the MOSFET.

Figure 13A:
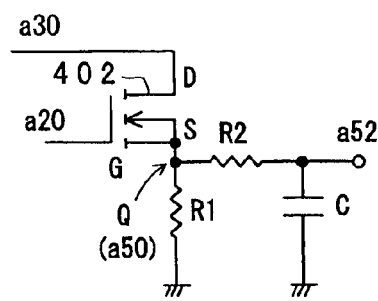
FIGS. 13A to 13C are diagrams for explaining a correction process performed by the voltage adjustment circuit in FIG. 12.
Figure 13B:
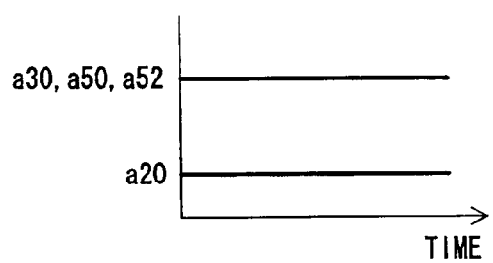
Figure 13C:
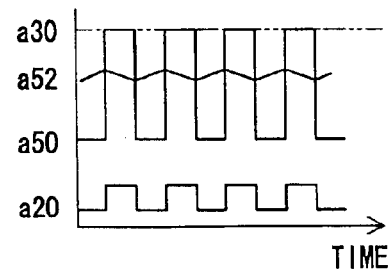

In addition, a variation in power supply voltage of the device control circuit 34 can be corrected by using the voltage adjustment circuit 60. This correction will be described below with reference to FIGS. 13A to 13C. FIG. 13A is a circuit diagram of an example of the voltage adjustment circuit 60, FIG. 13B and FIG. 13C are waveform charts showing the operation of the voltage adjustment circuit 60 shown in FIG. 13A. As shown in FIG. 13A, the voltage adjustment circuit 60 includes an N-channel MOSFET 402, resistors R1 and R2, and a capacitor C. The drain terminal (D) of the N-channel MOSFET 402 is connected to the power supply Vcc, and the source terminal (S) is connected to the resistors R1 and R2. One terminal of the resistor R1 is grounded. The resistor R2 is connected to the capacitor C to form a low-pass filter. A power supply voltage signal a20 is input to the drain terminal of the N-channel MOSFET 402, and a correction signal a20 is input from the correction circuit 38 to the gate terminal (G) thereof. A branch point between the source terminal of the N-channel MOSFET 402 and the resistor R1 is defined as a branch point Q.

FIG. 13B is a waveform chart showing an operation of the voltage adjustment circuit 60 when the power supply voltage of the device control circuit 34 falls within a predetermined range. The correction signal a20, the power supply voltage signal a30, an output signal a50 at the point Q, and an output signal (power supply voltage output signal) a52 from the voltage adjustment circuit 60 are direct current (DC) signals. The power supply voltage signal a30, the Q-point output signal a50, and the power supply voltage output signal a52 have equal levels. FIG. 13C is a waveform chart showing an operation of the voltage adjustment circuit 60 when the power supply voltage of the device control circuit 34 falls outside the predetermined range (power supply voltage is equal to a reference value or more). In this case, in the voltage adjustment circuit 60, a pulsed correction signal a20 is input to the gate terminal of the N-channel MOSFET 402. The correction signal a20 is converted to a pulse shaped signal by the operation of the N-channel MOSFET 402. The high level of the pulse shaped signal exhibits a power supply voltage (Vcc). The pulse shaped signal is output to the point Q (refer to the signal a50). Then, the signal a50 passes through the low-pass filter consisted of the resistor R2 and the capacitor C to remove a high-frequency component from the signal a50 at the point Q, and becomes a low-frequency signal having a proper level. The low-frequency signal is output from the voltage adjustment circuit 60 (refer to the signal a52). As described above, it is understood that the voltage adjustment circuit 60 corrects the variation in the power supply voltage of the device control circuit 34. The above configuration and the above operation of the voltage adjustment circuit 60 is one example among many. The configuration and operation of the voltage adjustment circuit 60 are not limited to them described above.

Figure 14:
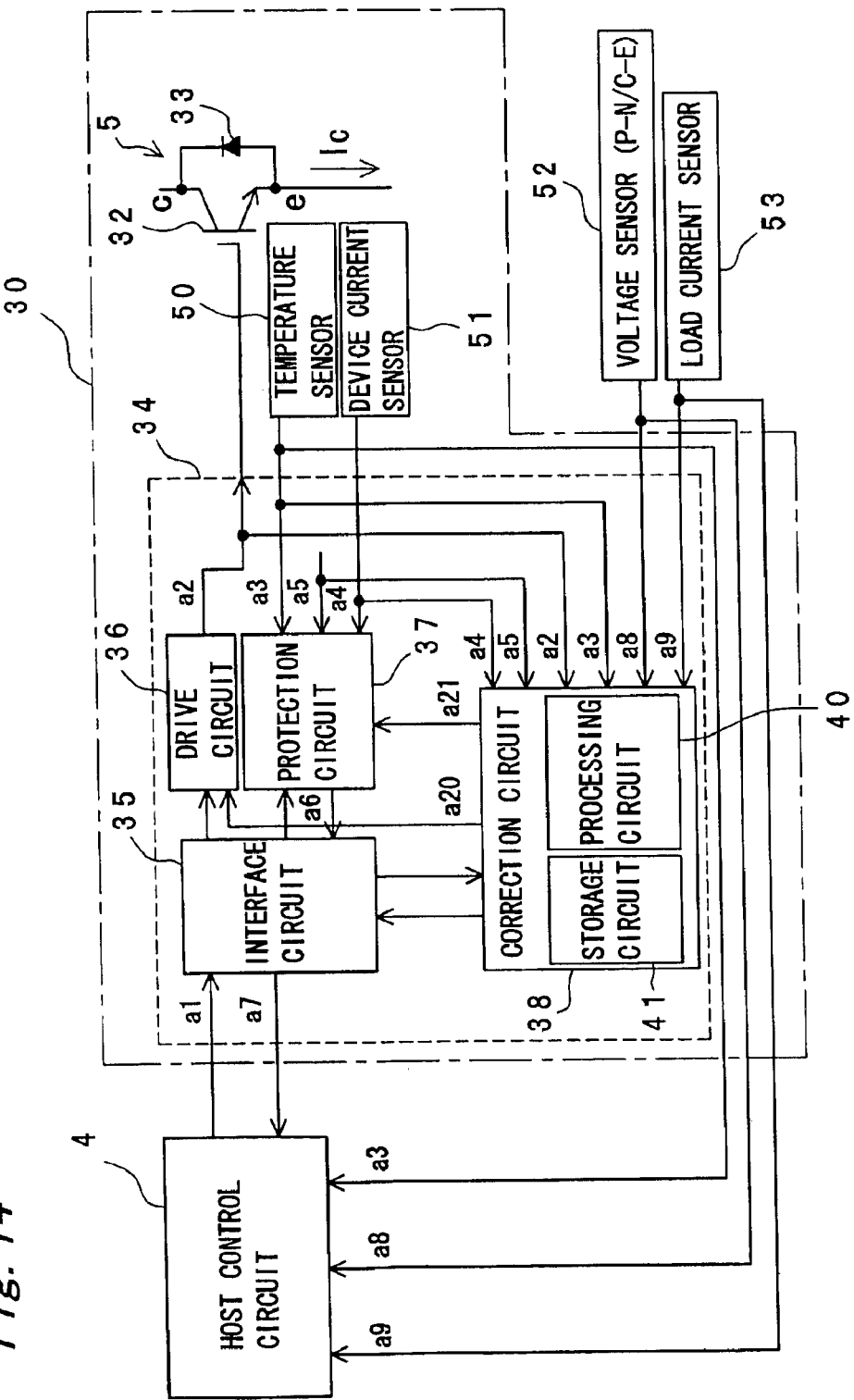
FIG. 14 is a block diagram of another power conversion apparatus according to the first embodiment of the present invention.

According to the power conversion apparatus 30 of the present invention, all necessary sensors are incorporated in one IC chip. However, some of the sensors may be arranged outside the IC chip. For example, FIG. 14 is a block diagram of the power conversion apparatus 30 when the voltage sensor 52 and the load current sensor 53 are arranged outside the power conversion apparatus 30. Even in this case, the same effect as that of the power conversion apparatus according to this embodiment can be obtained.

Figure 15:
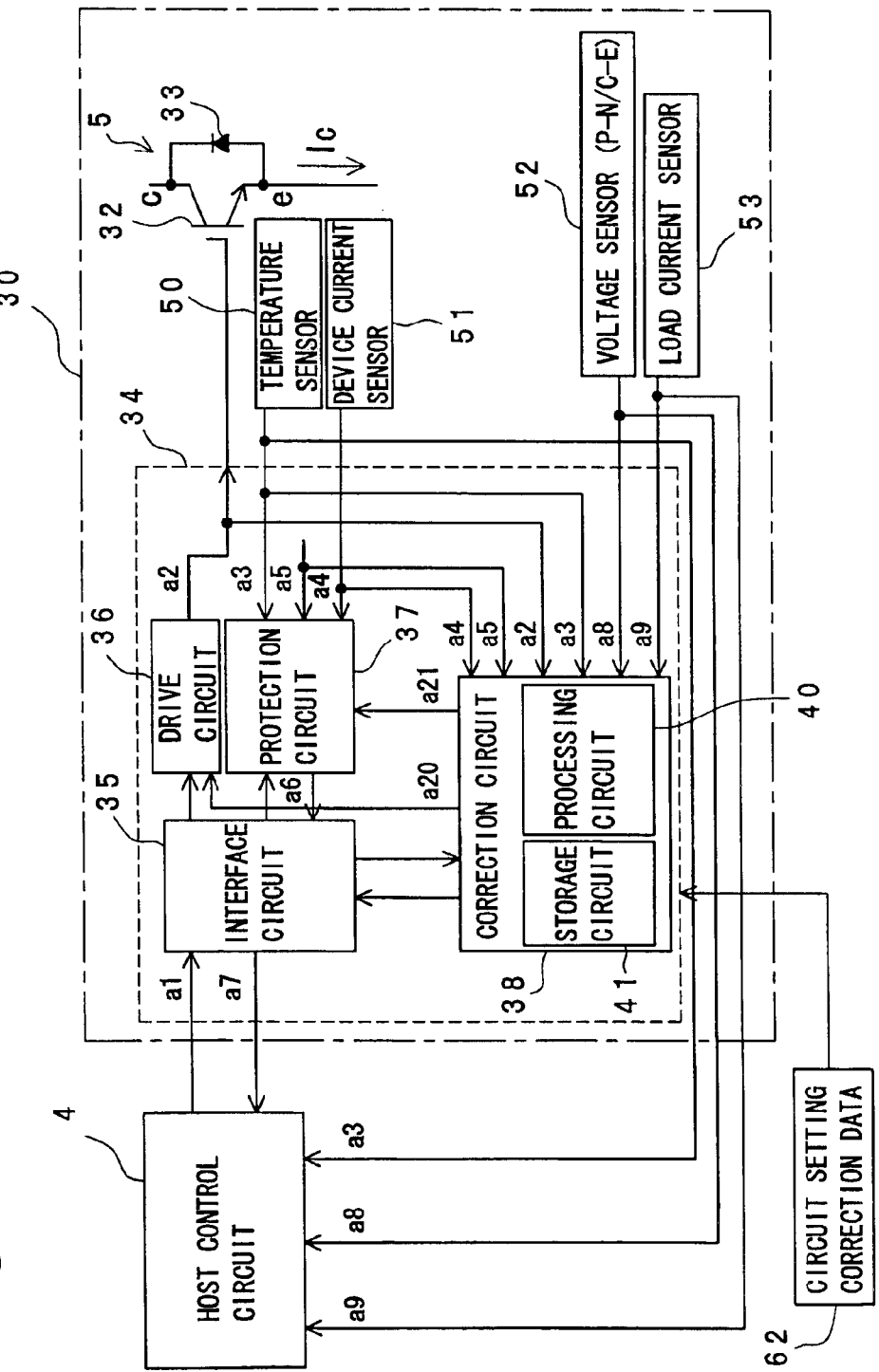
FIG. 15 is a block diagram of still another power conversion apparatus according to the first embodiment of the present invention.
Figure 16:
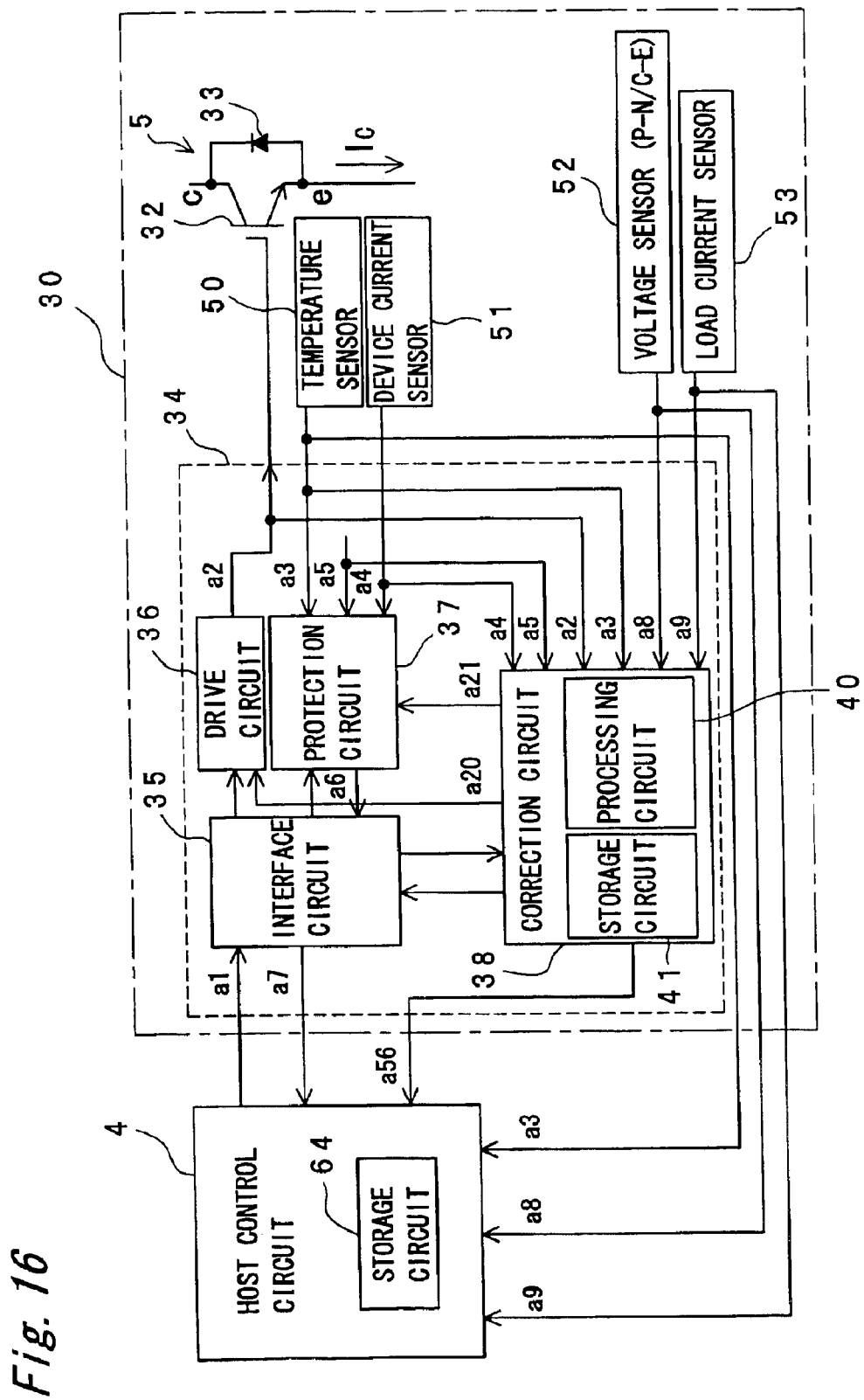
FIG. 16 is a block diagram of still another power conversion apparatus according to the first embodiment of the present invention.

In the power conversion apparatus 30 according to this embodiment, the correction circuit 38 calculates the correction data which it outputs therein. However, as shown in FIG. 15, the correction data may be set by using a circuit to set a correction data 62 arranged outside the power conversion apparatus 30. In this case, the specifications of the power conversion apparatus can be changed depending on customer's needs even if it is after the power conversion apparatus is shipped as a product. Further, when the correction storage circuit 41 is an EEPROM, the contents (correction data) of the correction storage circuit 41 can be changed (rewritten) from the outside any number of times by using the circuit to set a correction data As shown in FIG. 16, in the power conversion apparatus 30 according to this embodiment, the correction circuit 38 may store the signals (a3, a4, a8, and a9) output from the various sensors and the value of the power supply voltage signal as of the device control circuit 34 as an operation history in the correction storage circuit 41 therein. In that case, the correction circuit 38 can have a function of transmitting the operation history to a storage circuit 64 of the host control circuit 4 as a signal a56 when an abnormality occurs in the power conversion apparatus 30. This is useful to recognize the operation state of the power conversion apparatus 30 when an abnormality occurs and to find out a reason for the abnormality. Further, the operation history data may be always stored in the storage circuit 64 of the host control circuit 4. This allows this function to be realized at low cost because the power conversion apparatus 30 need not excessively have a storage device. In addition, in that case, the abnormal state can be more reliably analyzed because the operation history data has been stored in the host control circuit 4, even though the correction storage circuit 41 is broken upon occurrence of an abnormality.

The power conversion apparatus 30 according to this embodiment may function as a High Voltage IC (HVIC).

Figure 17A:
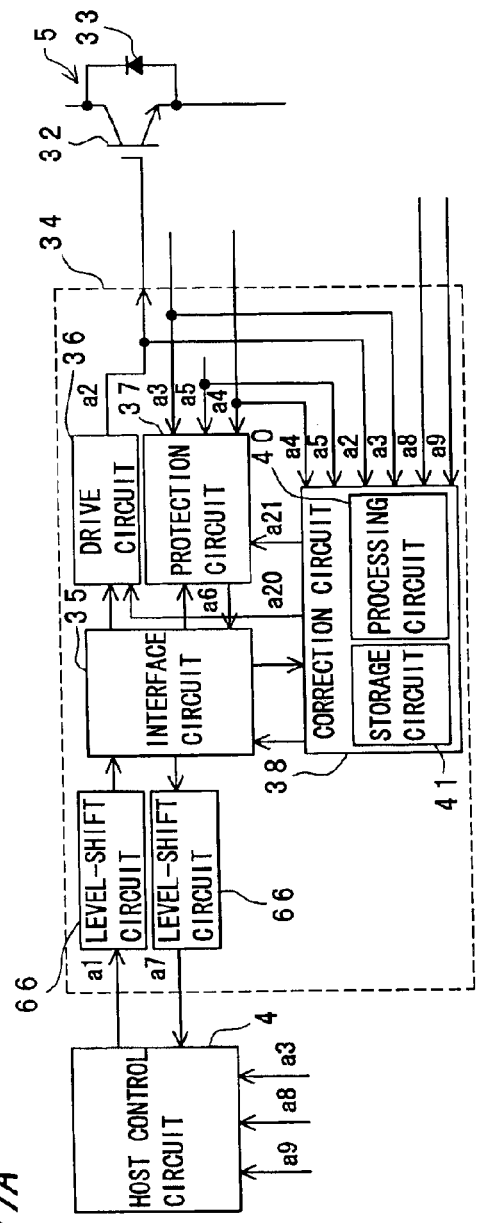
FIGS. 17A and 17B are block diagrams showing connections between a host control circuit and a device control circuit.
Figure 17B:
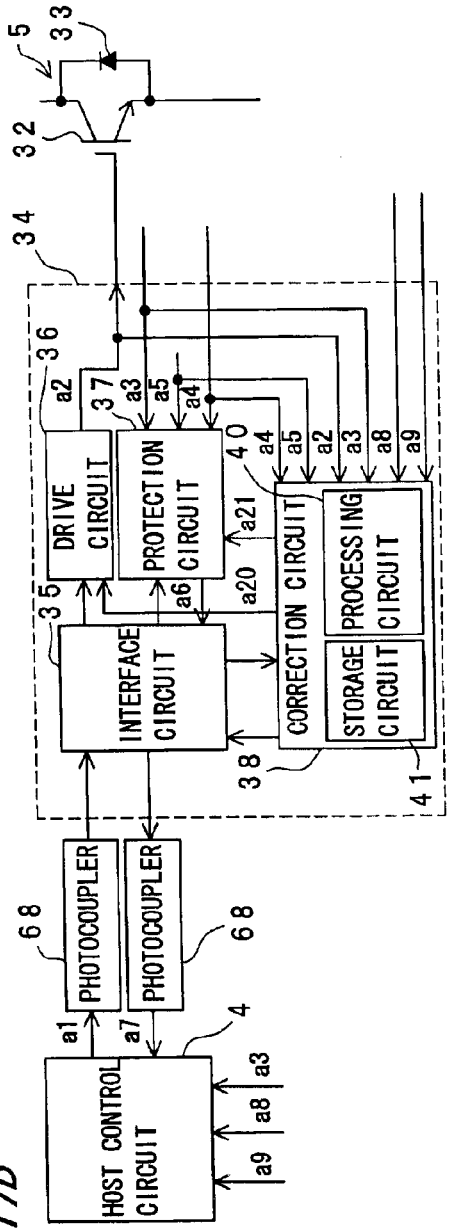

FIG. 17A shows connections between the device control circuit 34 and the host control circuit 4. As shown in FIG. 17A, a level-shift circuit 66 with a high-withstand-voltage device is incorporated in the device control circuit 34. The configuration in which the level-shift circuit 66 is arranged between the device control circuit 34 and the host control circuit 4 prevents a drawback that signal transmission is not normally performed between them when the power supply voltage of the device control circuit 34 varies with the operation of the IGBT 32. FIG. 17B shows conventional connections between the device control circuit 34 and the host control circuit 4. As shown in FIG. 17B, a photocoupler 68 which is a discrete part is arranged between the host control circuit 4 and the device control circuit 34 to make it possible to perform normal signal transmission between them. Comparing the two cases, when the level-shift circuit 66 is arranged in the device control circuit 34, a higher-reliable power conversion apparatus can be realized at cost lower than when photocoupler 68 is arranged in that.

Second Embodiment

A power conversion apparatus according to a second embodiment will be described below. The power conversion apparatus according to this embodiment is different from the power conversion apparatus according to the first embodiment in that the correction circuit 38 obtains input signals at only leading edges and trailing edges of the drive signal a2, and outputs correction signals representing correction data based on the input signals obtained at the leading edges and the trailing edges of the drive signal a2 to a drive circuit 36 and a protection circuit 37 at the next leading edges and the next trailing edges of the drive signal a2. The other operations and configurations of this power conversion apparatus are the same as those of the power conversion apparatus 30 according to the first embodiment. The power conversion apparatus according to the second embodiment will be described below with reference to FIG. 2.

FIG. 18 is a waveform chart for explaining the operation of the correction circuit according to this embodiment. In FIG. 18, a waveform (1) indicates a drive signal a1 output from a host control unit 4, a waveform (2) indicates a drive signal a2 input to an IGBT 32 when the drive signal a1 is output, a waveform (3) indicates the output voltage ($V_{CE}$) of the IGBT 32 when the drive signal a2 of the waveform (2) is input, and a waveform (4) indicates an output current ($I_C$) of the IGBT 32 when the drive signal a2 of the waveform (2) is input. As shown in FIG. 18, the correction circuit 38 outputs a correction signal (a20) based on input signals (a2, a8, and a9) obtained at a leading edge of the drive signal a2 to the drive circuit 36 at the next leading edge of the drive signal a2. And, the correction circuit 38 outputs a correction signal (a20) based on input signals (a2, a8, and a9) obtained at a trailing edge of the drive signal a2 to the drive circuit 36 at the next trailing edge of the drive signal a2. More specifically, the correction signal (a20) output from the correction circuit 38 at a leading edge of the drive signal a2 is generated on the basis of the input signals obtained by the correction circuit 38 at another leading edge thereof. The another leading edge of the drive signal a2 is one leading edge thereof previous to the leading edge thereof at which the correction circuit 38 outputs the correction signal a20. And, the correction signal a20 output from the correction circuit 38 at a trailing edge of the drive signal a2 is generated on the basis of the input signals obtained by the correction circuit 38 at another leading edge thereof. The another trailing edge of the drive signal a2 is one trailing edge thereof previous to the trailing edge thereof at which the correction circuit 38 outputs the correction signal a20. In this case, the frequency of the drive signal a1 input to the power conversion apparatus 30 is generally several kHz to 20 kHz. One cycle of the drive signal a1 is at least 50 μs. Thus, a propagation delay time of the device control circuit 34 must be several tens of micro seconds after signals are output from the voltage sensor 52 and the load current sensor 53 until the gate drive signal a2 is output.

This is also applied to a case in which the correction circuit 38 outputs a correction signal a21 to the protection circuit 37. The correction circuit 38 outputs a correction signal a21 based on the input signals (a3, a4, and a5) obtained at a leading edge of the drive signal a2 to the protection circuit 37 at the next leading edge of the drive signal a2. The correction circuit 38 outputs a correction signal a21 based on the input signals (a3, a4, and a5) obtained at a trailing edge of the drive signal a2 to the protection circuit 37 at the next trailing edge of the drive signal a2. More specifically, the correction signal a21 output from the correction circuit 38 at a leading edge of the drive signal a2 is generated on the basis of the input signals obtained by the correction circuit 38 at another leading edge thereof. The another leading edge of the drive signal a2 is one leading edge thereof previous to the leading edge thereof at which the correction circuit 38 outputs the correction signal a21. And, the correction signal a20 output from the correction circuit 38 at a trailing edge of the drive signal a2 is generated on the basis of the input signals obtained by the correction circuit 38 at anther trailing edge thereof. The another trailing edge of the drive signal a2 is one trailing edge thereof previous to the trailing edge thereof at which the correction circuit 38 outputs the correction signal a20. Therefore, also in this case, a propagation delay time of the device control circuit 34 may be several tens of micro seconds after the temperature signal a3, the device current signal a4, and the power supply voltage signal a5 are output, and the correction process is performed by the correction circuit 38 until the correction signal a21 is output to the protection circuit 37.

In the power conversion apparatus according to this embodiment, the correction circuit 38 outputs the correction signals a20 and a21 based on the input signals obtained at a timing, at a timing one cycle of the drive signal a2 after the timing. More specifically, the correction circuit 38 outputs the correction signals a20 and a21 at a leading edge of the drive signal a2 on the basis of the data obtained at another leading edge thereof. The another leading edge of the drive signal a2 is one leading edge thereof previous to the leading edge thereof at the correction circuit 38 outputs the correction signals a20 and a21. And, the correction circuit 38 outputs the correction signals a20 and a21 at a trailing edge of the drive signal a2 on the basis of the data obtained at another trailing edge thereof. The another trailing edge of the drive signal a2 is one trailing edge thereof previous to the trailing edge thereof at the correction circuit 38 outputs the correction signals a20 and a21. Therefore, according to the power conversion apparatus of this embodiment, a response time (that is, a time required for a feedback operation performed from the correction circuit to the drive circuit and the protection circuit) from when signals are input from various sensors to when a correction signal is output can be elongated. In addition, the correction circuit can be realized by using less expensive lower-speed circuit. As a result the power conversion apparatus can be constituted at lower cost.

Figure 19:
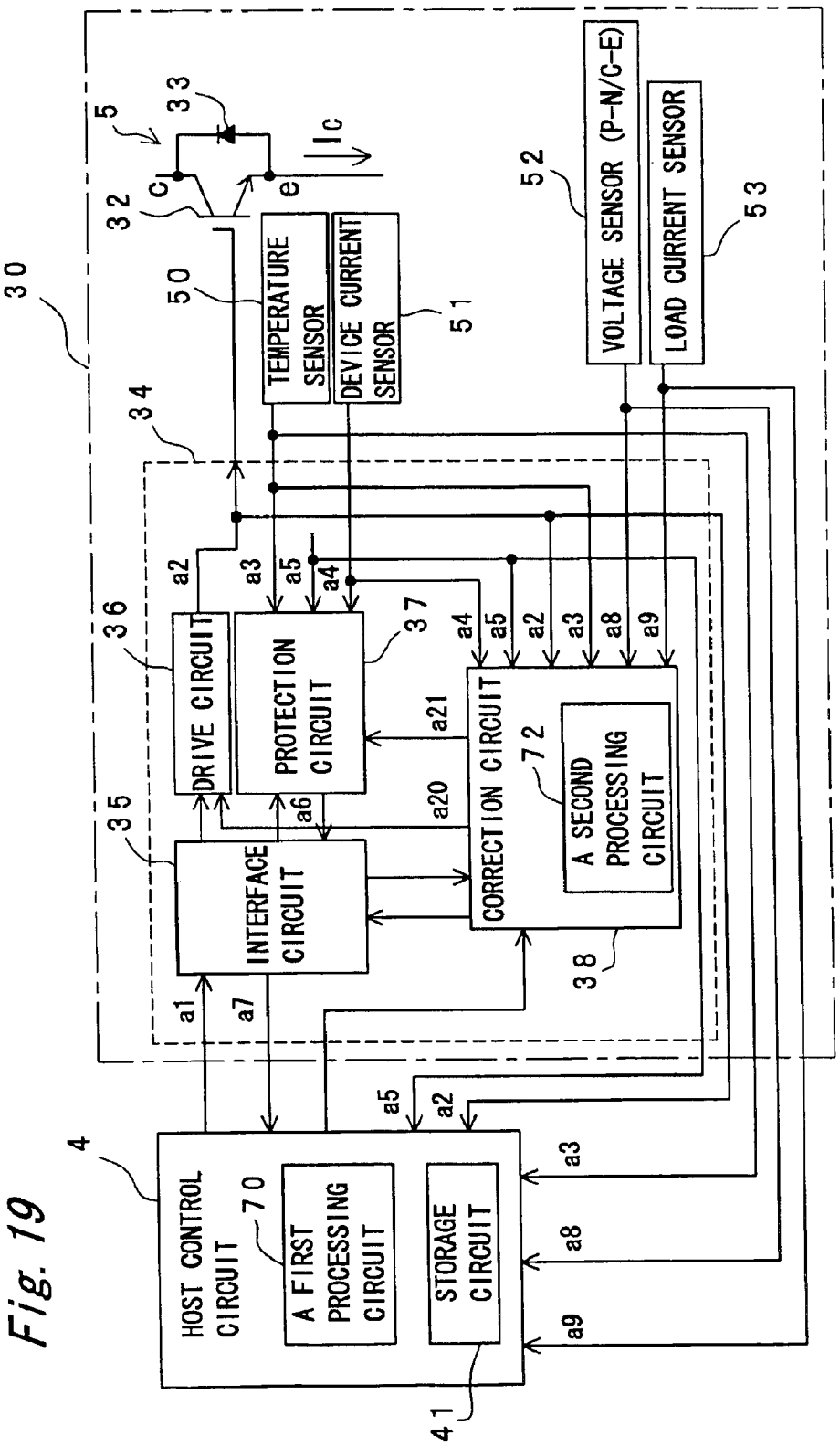
FIG. 19 is a block diagram of a power conversion apparatus and a host control circuit when a part of a correction processing circuit of the correction circuit is incorporated in the host control circuit.

According to the power conversion apparatus of this embodiment, enough time is allowed for a correction process. Therefore, as shown in FIG. 19, a part of the correction processing circuit, consisted of a first correction processing circuit 70 and a second correction processing circuit 72, can be incorporated in the host control circuit 4 to reduce a load on the correction circuit 38 in the power conversion apparatus 30. Thus, a more simple correction circuit can be realized. As a result, the power conversion apparatus can be constituted at lower cost.

According to the power conversion apparatus of this embodiment, the correction circuit 38 performs the correction process at a leading edge of the drive signal a2 on the basis of data obtained at another leading edge, which is one leading edge thereof previous to the leading edge thereof at which the correction circuit 38 performs the correction process. And, the correction circuit 38 performs the correction process at a trailing edge of the drive signal a2 on the basis of data obtained at a trailing edge at another trailing edge thereof, which is one trailing edge thereof previous to the trailing edge thereof at which the correction circuit 38 performs the correction process. However, for example, if a rate of a change of each of an output voltage $V_{CE}$ of IGBT 32 and an output current $I_C$ thereof are small, the correction signal may be output on the basis of data obtained at two or more of leading edges of the drive signal a2 previous to the leading edge thereof at which the correction signal is output, and on the basis of data obtained at two or more of trailing edges thereof previous to the trailing edge thereof at which the correction signal is output. In this case, a power conversion apparatus can be realized at a lower cost than the above-mentioned power conversion apparatus because its correction circuit can be realized by using an inexpensive lower-speed circuit.

Figure 20:
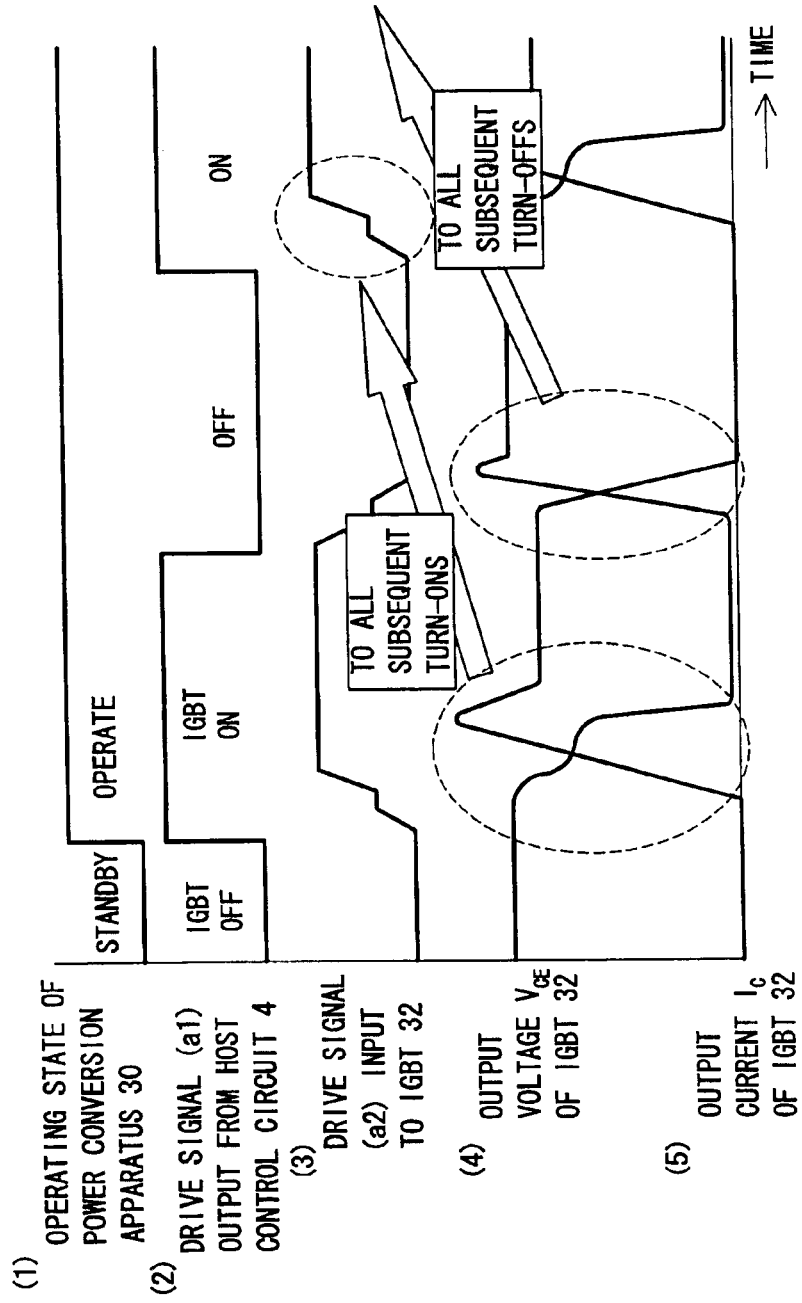
FIG. 20 is a waveform chart for explaining an operation of the correction circuit when a correction process is performed only once at the start-up of the power conversion apparatus.

The correction circuit 38 can perform the correction process only once at the start-up of the power conversion apparatus 30. FIG. 20 is a waveform chart for explaining the operation of the correction circuit 38 in the above case. As shown in FIG. 20, the correction circuit 38 outputs correction signal a20 based on input signals (a2, a8, and a9) obtained at the first leading edge of the drive signal a2 after the start-up of the power conversion apparatus 30, at all the subsequent leading edges of the drive signal a2. And, the correction circuit 38 outputs correction signal a20 based on input signals (a2, a8, and a9) obtained at the first trailing edge of the drive signal a2 after the start-up of the power conversion apparatus 30, at all the subsequent trailing edges of the drive signal a2. In this case, correction data based on the input signals obtained at the first leading edge and the first trailing edge of the drive signal a2 after the start-up of the power conversion apparatus 30 are stored in the correction storage circuit 41. The correction circuit 38 reads the stored correction data from the correction storage circuit 41, and outputs the correction data to the drive circuit 36 at all the subsequent leading edges and all the subsequent trailing edges of the drive signal a2. This operation can also be applied to a case in which the correction circuit 38 outputs the correction signal a21 to the protection circuit 37. In the above cases, the circuit scale of the correction circuit can be further reduced because the correction circuit operates intermittently. As a result, the lower-speed correction circuit can be simply constituted, and therefore a power conversion apparatus can be realized at lower cost. In this case, the power conversion apparatus is allowed to have much enough time for the correction process. Therefore, as shown in FIG. 19, the correction storage circuit 41 of the correction circuit 38 may be incorporated in the host control circuit 4 to reduce a load on the correction circuit 38 in the power conversion apparatus 30. As a result, a more simple correction circuit can be realized, and therefore the power conversion apparatus can be constituted at lower cost.

Figure 21:
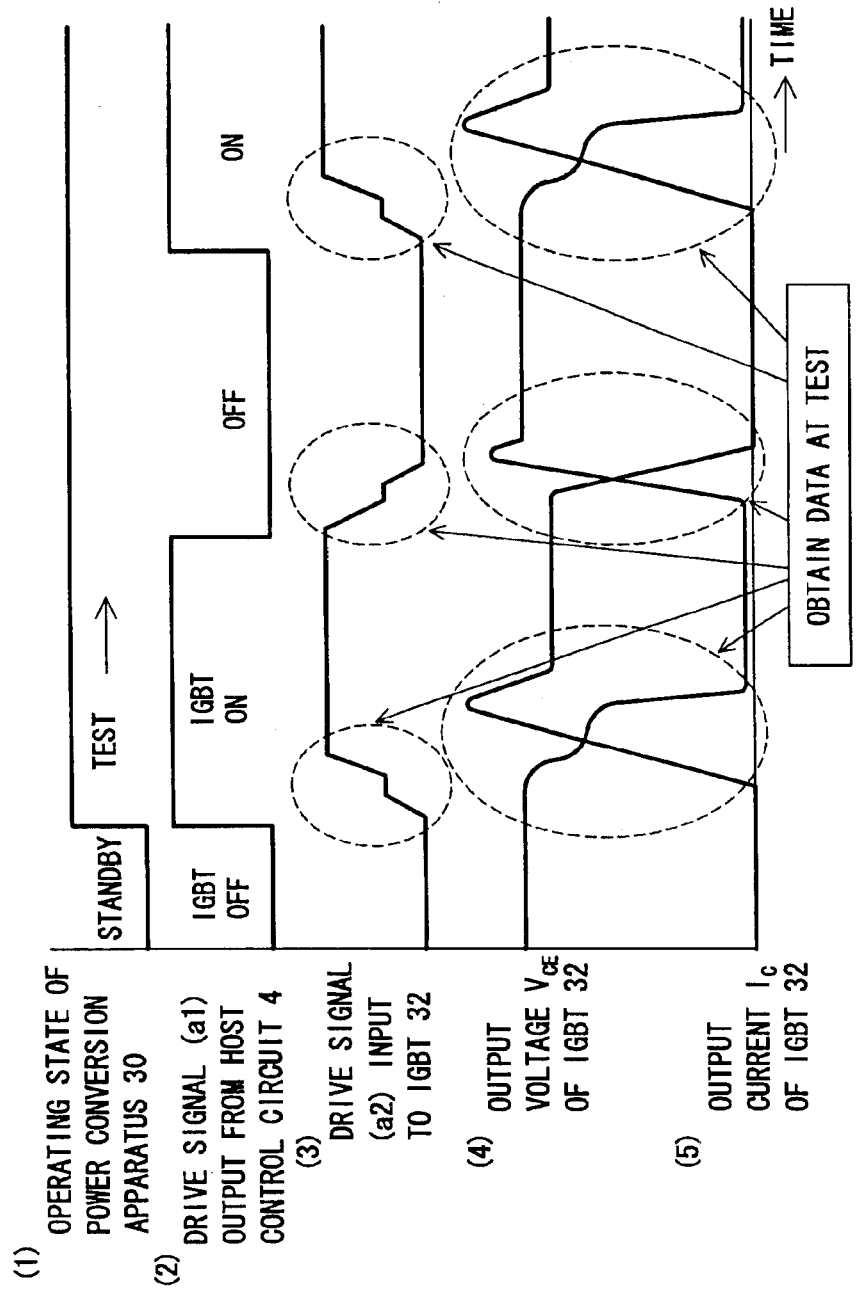
FIG. 21 is a diagram for explaining an operation of the correction circuit when a correction process is performed in only a product test before shipping of a power conversion apparatus.

The correction circuit 38 can also perform the correction process only in a product test before shipping for the power conversion apparatus 30. FIG. 21 is a waveform chart for explaining the operation of the correction circuit 38 in this case. As shown in FIG. 21, the correction circuit 38 obtains the values of signals input to the correction circuit 38 and the values of correction data obtained by the input signals when the power conversion apparatus 30 operates in the product test. More specifically, the correction circuit 38 stores the values of the input signals and the correction data based on the input signals in the product test for the power conversion apparatus 30, and performs the correction process by using data in the correction storage circuit 41 when the power conversion apparatus 30 operates after shipping.

Figure 22:
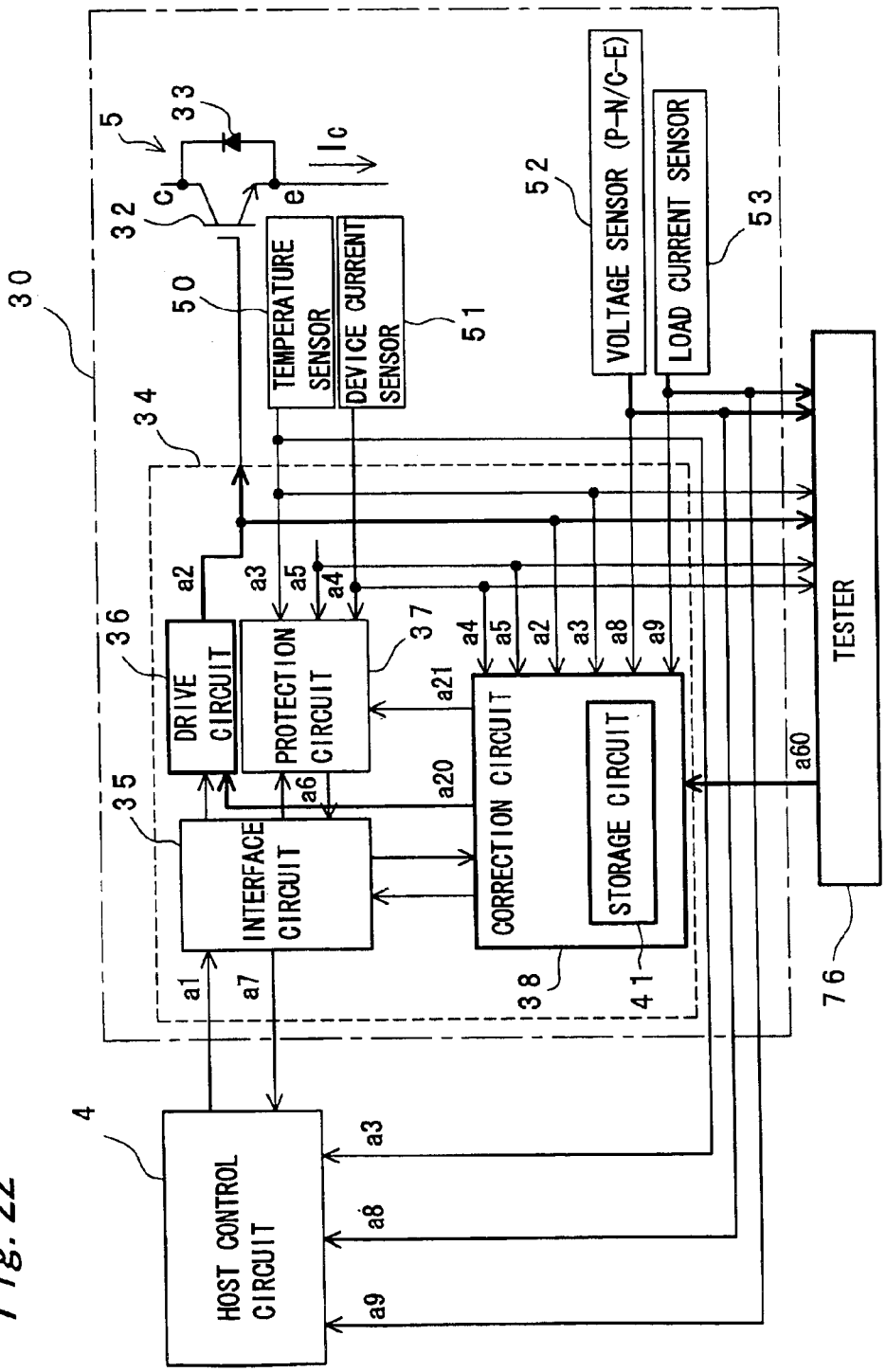
FIG. 22 is a diagram showing a flow of signals in the power conversion apparatus and a tester when the tester is arranged outside the power conversion apparatus.

The correction data stored in the correction storage circuit 41 need not be obtained by the correction process performed by the correction circuit 38. The correction data may be obtained by a correction process performed by an external device. FIG. 22 is a diagram showing a flow of signals in the power conversion apparatus 30 and a tester 76 when the tester 76 performs the correction process (correction for the drive signal a2). The tester 76 obtains the drive signal a2, a signal a8 output from the voltage sensor 52, and a signal a9 output from the load current sensor 53. The tester 76, as described above, calculates a switching loss and a surge voltage by using the values of these signals (a2, a8, and a9). When the values of these signals fall outside a predetermined range, the tester 76 calculates correction data for correcting the obtained drive signal a2 such that the values fall within the predetermined range. The tester 76 outputs the obtained data and the data of the input signals used for calculating the correction data to the correction circuit 38 as a signal a60. When the correction circuit 38 obtains the signal a60, it outputs a correction signal a20 of the correction data represented by the signal a60 to the drive circuit 36, and stores the values of the input signals and the correction data which are represented by the signal a20 in the correction storage circuit 41.

Figure 23:
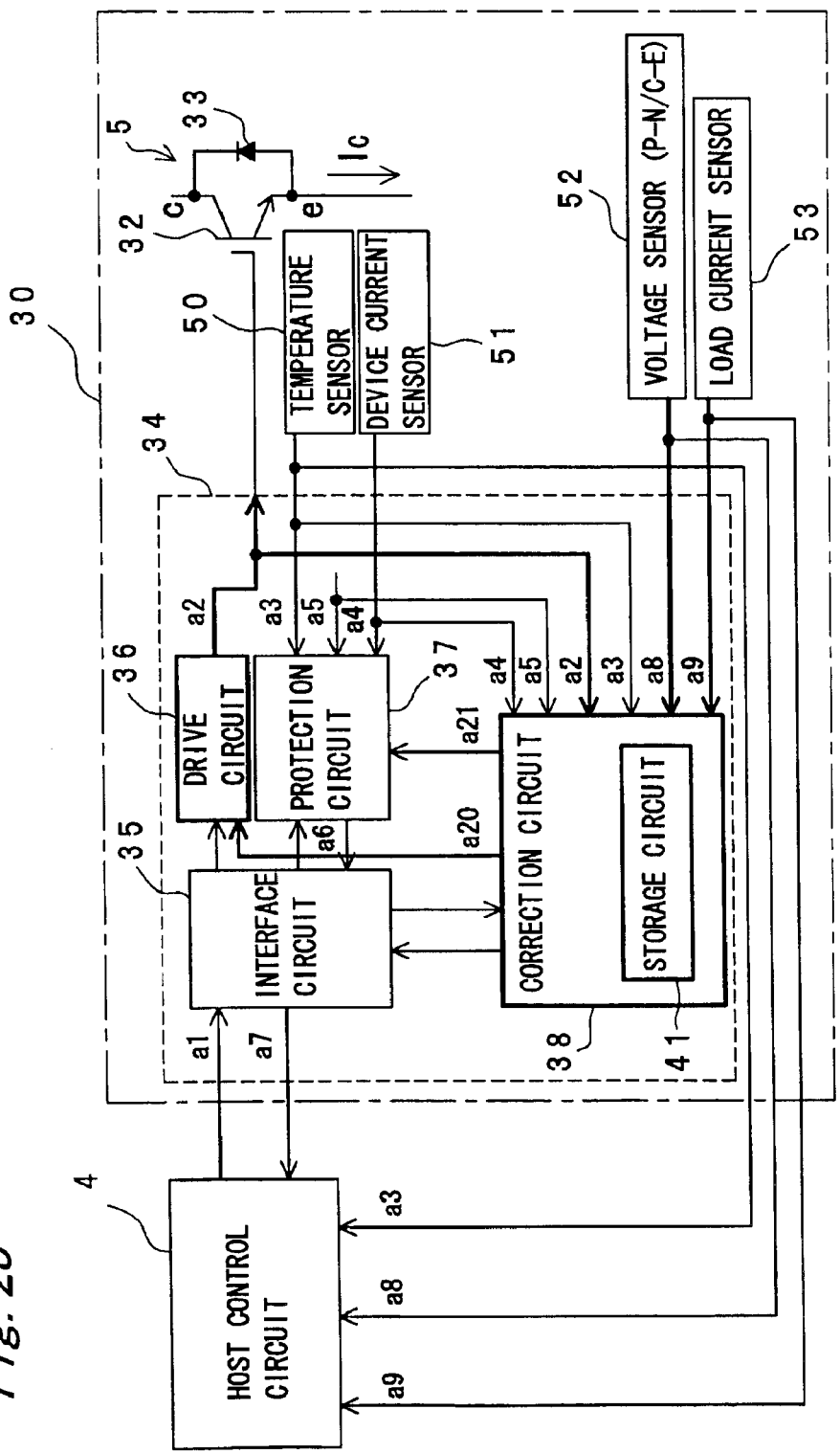
FIG. 23 is a diagram showing a flow of signals in the power conversion apparatus when the correction circuit performs a correction process by using data in a correction storage circuit.

FIG. 23 is a diagram showing a flow of signals in the power conversion apparatus 30 when the correction circuit 38 performs the correction process by using the data in the correction storage circuit 41, when the power conversion apparatus 30 operates after shipping. When the correction circuit 38 obtains the input signals a2, a8, and a9, the correction circuit 38 refers to the correction storage circuit 41 to detect signals which are the same or almost the same as the input signals obtained at the present. The correction circuit 38 obtains correction data corresponding to the detected signals and outputs the correction signal a20 representing the correction data to the drive circuit 36.

Figure 24:
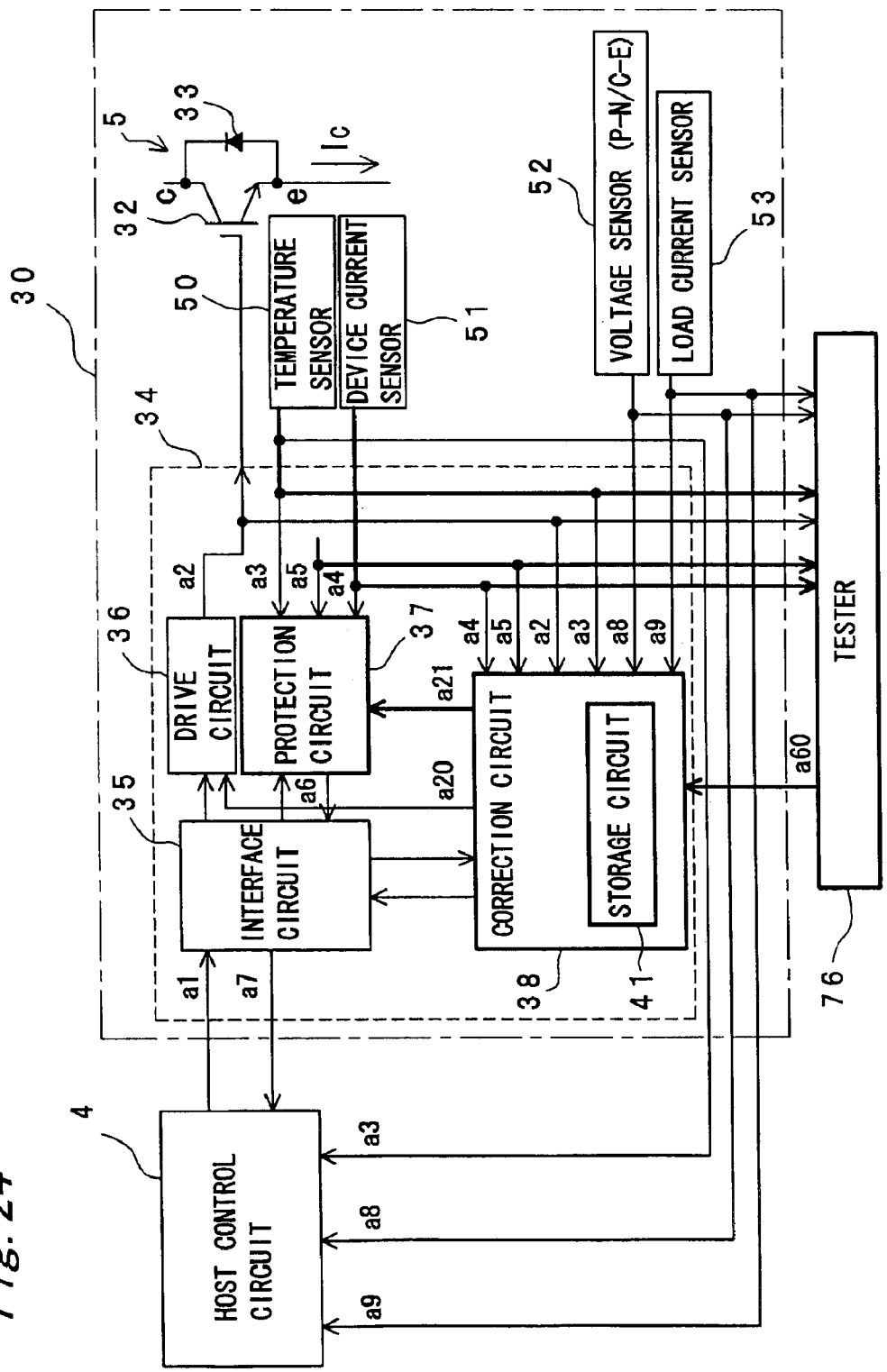
FIG. 24 is a diagram showing an another flow of signals in the power conversion apparatus and the tester when the tester is arranged outside the power conversion apparatus.

The above is also applied to a case in which the correction circuit 38 outputs the correction signal a21 to the protection circuit 37. FIG. 24 is a diagram showing a flow of signals in the power conversion apparatus 30 and the tester 76 when the tester 76 performs a correction process for the protection circuit 37. A description of this flow will be omitted because it is similar to the flow in the case (FIG. 22) in which the tester 76 performs a correction process for the drive circuit 36.

As described above, when the correction process is performed in the tester arranged outside the power conversion apparatus, the more simple correction circuit can be realized, and therefore a low-cost power conversion apparatus can be realized.

Further, as shown in FIG. 19, the correction process may be performed in both the correction processing circuits 70 and 72 by incorporating a part of the correction circuit 38 in the host control circuit 4. In this case, a load on the correction circuit 38 inside the power conversion apparatus 30 is reduced, a more simple correction circuit can be realized. As a result, the power conversion apparatus can be constituted at lower cost. In addition, when the correction storage circuit 41 is also incorporated in the host control circuit 4 to reduce a load on the correction circuit 38 inside the power conversion apparatus 30, a more simple correction circuit can be realized. As a result, the power conversion apparatus can be constituted at lower cost.

The correction process may be performed at any timing from the outside of the power conversion apparatus 30. In this case, the power conversion apparatus can be designed with high accuracy.

Third Embodiment

Figure 25:
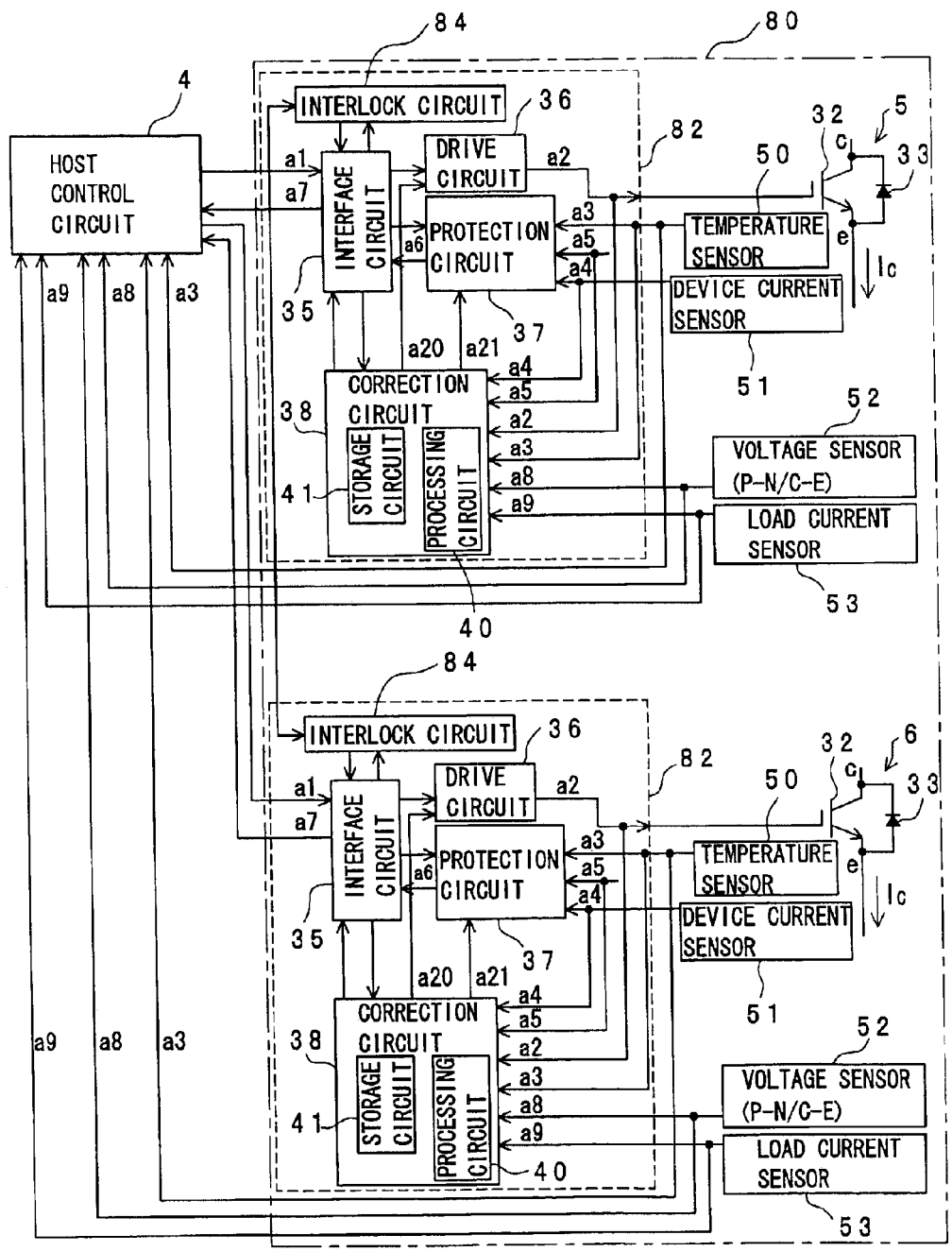
FIG. 25 is a block diagram of a power conversion system according to the present invention including a P-side circuit and an N-side circuit.

FIG. 25 is a block diagram of a power conversion system having a P-side (upper arm) and N-side (lower arm) circuits. As shown in FIG. 25, each of P-side circuit and N-side circuit includes the configurations of the power conversion apparatus 30 described in the first and second embodiments. In a power conversion system 80 according to the third embodiment, an interlock circuit 84 is arranged in each of P-side and N-side device control circuits 82. When the host control circuit 4 outputs signals to make both of P-side and N-side device control circuits 82 turn on the IGBTs, the interlock circuits 84 cancels one of the signals. Thus, short-circuit breakdown or an erroneous operation caused by simultaneously turning on the IGBTs can be prevented.

A three-phase motor can be realized by using three power conversion systems according to this embodiment. That is, the power conversion unit in the inverter as shown in FIG. 1 can be consisted of three IC chips. The power conversion system constitutes a half bridge, thus it can easily applied to not only a three-phase motor but also any other H bridge. Therefore, the power conversion system according to this embodiment can be advantageously used for various purposes.

Figure 26:
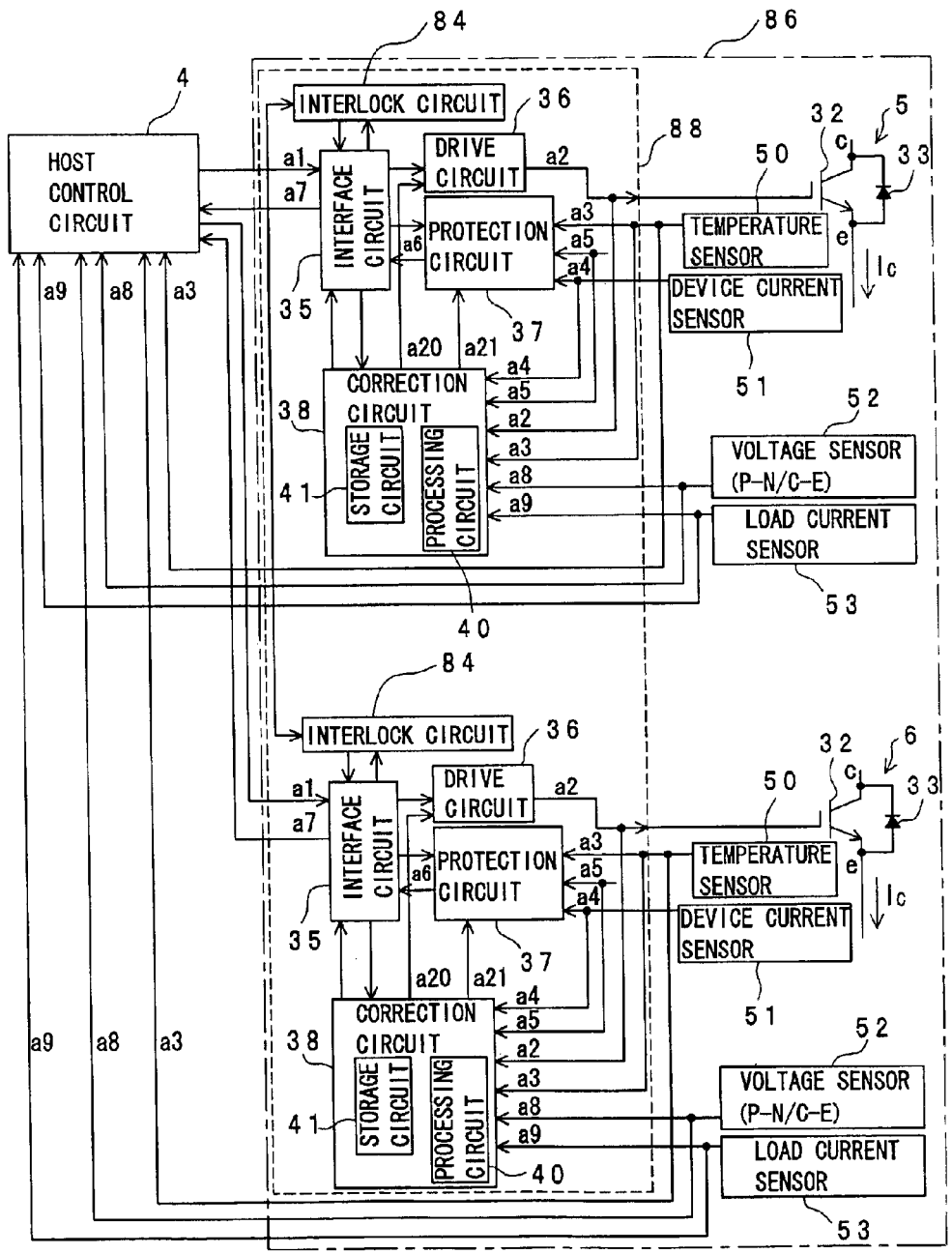
FIG. 26 is a block diagram of a power conversion system according to the present invention including one device control circuit.

Further, two device control circuits 82 on the P side (upper arm) and the N side (lower arm) can be constituted by one device control circuit. FIG. 26 is a block diagram of a power conversion system having one device control circuit. According to the power conversion system 86 having one device control circuit 88 shown in FIG. 26, the number of parts can be reduced, and the circuit scale can be reduced.

Figure 27:
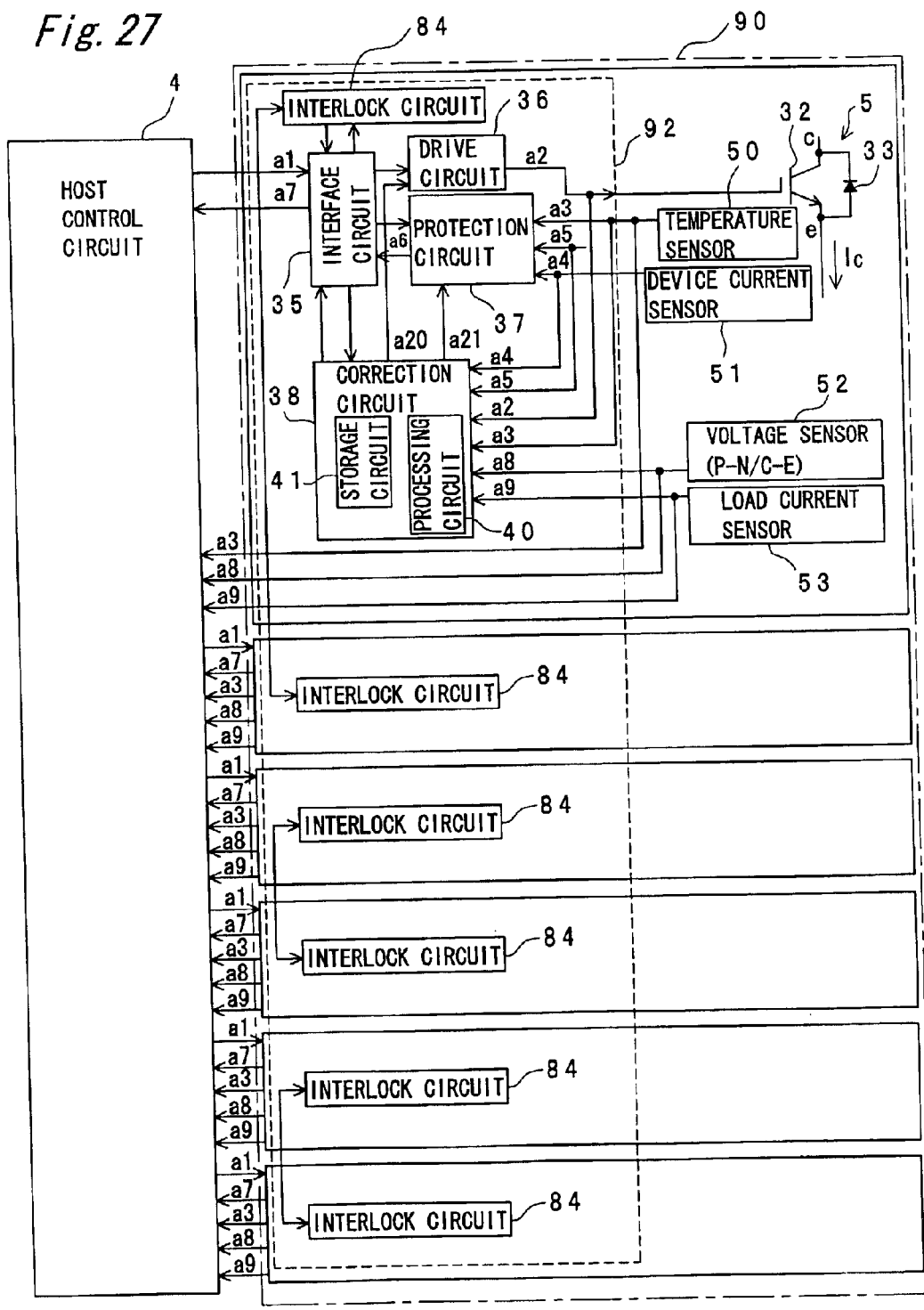
FIG. 27 is a block diagram of a power conversion system according to the present invention in which six device control circuits are integrated to one device control circuit.

Further, six device control circuits required for driving a three-phase motor may be integrated to one device control circuit. FIG. 27 is block diagram of power conversion system in which six device control circuits are integrated to one device control circuit. The power conversion unit in an inverter as shown in FIG. 1 can be consisted of one IC chips by using the power conversion system as shown in FIG. 27. According to the power conversion system shown in FIG. 27, the number of parts can be more reduced, and the circuit scale can be more reduced.

The power conversion system according to the third embodiment may have the same constitution as each of the power conversion apparatus described in the first and second embodiments. Therefore, the same effect as that in the power conversion apparatus according to the first or second embodiment can be obtained.

It will be obvious to those having skill in the art that many changes may be made in the above-described details of the preferred embodiments of the present invention. The scope of the present invention, therefore, should be determined by the following claims.

What is claimed is:

1. A power conversion apparatus comprising:
a power switching device;
a voltage sensor which detects an output voltage of said switching device to output a first signal depending on the output voltage;
a current sensor which detects an output current of said switching device to output a second signal depending on the output current; and
a device controller connected to said switching device, said voltage sensor, and said current sensor;
wherein said device controller includes:
a driver connected to said switching device; and
a correcter connected to said driver, said voltage sensor and said current sensor;
said driver outputs a third drive signal to said switching device; and
said correcter
obtains the first signal from said voltage sensor, the second signal from said current sensor, and the third signal from said driver;
calculates a switching loss by using a value of the first signal and a value of the second signal;
compares a value of the switching loss with a first reference value, and the value of the first signal with a second reference value; and
corrects the value of the third signal, when at least one of a condition in which the value of the switching loss exceeds the first reference value and a condition in which the value of the first signal exceeds the second reference value is satisfied, such that the exceeding value is not larger than the corresponding reference value.

2. The power conversion apparatus according to claim 1, wherein said driver comprises:
a variable resistor connected to said switching device; and
a resistor controller connected to said variable resister;
wherein said correcter outputs a fourth signal to said resistor controller, representing a first resistance value to be employed by said variable resister;
said resistor controller changes the resistance value of said variable resistor based on the fourth signal such that the resistance value of said variable resistor is equal to the first resistance value; and
said variable resistor applies a voltage depending on the resistance value thereof to a control terminal of said switching device.

3. The power conversion apparatus according to claim 1, wherein said driver comprises:
a transistor connected to said switching device;
a transistor driver connected to said transistor;
wherein said correcter outputs a fourth signal to said transistor driver, representing a value of a fifth signal to be output by said transistor driver to said transistor;
said transistor driver outputs the fifth signal having the value represented by the fourth signal to a control terminal of said transistor; and
said transistor outputs a current depending on the fifth signal to a control terminal of said switching device.

4. The power conversion apparatus according to claim 1, wherein said driver comprises:
a plurality of transistors connected to said switching device, and connected in parallel to each other; and
a transistor driver connected to said plurality of transistors;
wherein said correcter outputs a fourth signal to said transistor driver, representing the number of transistors to which a fifth signal is to be output by said transistor driver;
said transistor driver outputs the fifth signal to at least one of said plurality of transistors number of which is represented by the fourth signal;
said transistor, to which the fifth signal is output, outputs a current to a control terminal of said switching device.

5. The power conversion apparatus according to claim 1, wherein said correcter obtains the first signal, the second signal, and the third signal as a sixth correction input signal at a leading edge and a trailing edge of the third signal,
said correcter corrects, at the leading edge of the third signal, the value of the third signal on the basis of the sixth signal obtained at another leading edge, and corrects, at the trailing edge of the third signal, the value of the third signal on the basis of the sixth signal obtained at another trailing edge; and
said another leading edge is a first predetermined number of the leading edges previous to the leading edge of the third signal at which said correcter corrects the value of the third signal, and said another trailing edge is a second predetermined number of the trailing edges previous to the trailing edge of the third signal at which said correcter corrects the value of the third signal.

6. The power conversion apparatus according to claim 1, wherein said correcter obtains the first signal, the second signal, and the third signal as a sixth correction input signal at a first leading edge of the third signal after said power conversion apparatus is started, and corrects, at all the subsequent leading edges of the third signal, the value of the third signal on the basis of the sixth signal obtained at the first leading edge; and
said correcter obtains the sixth signal at a first trailing edge of the third signal after said power conversion apparatus is started, and corrects, at all the subsequent trailing edges of the third signal, the value of the third signal on the basis of the sixth signal obtained at the first trailing edge.

7. The power conversion apparatus according to claim 2, wherein said correcter comprises a storage circuit which stores the fourth signal.

8. The power conversion apparatus according to claim 3, wherein said correcter comprises a storage circuit which stores the fourth signal.

9. The power conversion apparatus according to claim 4, wherein said correcter comprises a storage circuit which stores the fourth signal.

10. The power conversion apparatus according to claim 1, wherein said device controller comprises a level-shifter which exchanges signals between said device controller and a controller which controls said power conversion apparatus.

11. A power conversion apparatus comprising;
a power switching device;
a state sensor which detects a drive state of said switching device to output a first signal depending on the drive state; and
a temperature sensor which detects a temperature of said switching device to output a second signal depending on the temperature; and
a device controller connected to said switching device, said state sensor and said temperature sensor;

wherein said device controller includes:
a protecter connected to said state sensor;
a correcter connected to said state sensor, said temperature sensor, and said protecter;
wherein said correcter obtains the first signal from said state sensor and the second signal from said temperature sensor to set a third reference value depending on the second signal, and outputs a third signal representing the third reference value to said protecter;
said protecter obtains the first signal from said state sensor, and compares the value of the first signal with the third reference value to output a fourth signal based on the comparison result.

12. The power conversion apparatus according to claim 11, wherein said protecter comprises:
a plurality of resistors connected in series which divides a reference voltage;
a selecter connected to said plurality of resistors,
a comparator connected to said selecter; wherein said selecter obtains the third signal, and selects at least one of said plurality of resistors to generate a comparison voltage by using the selected at least one of said plurality of resistors and the reference voltage such that the comparison voltage is equal to the third reference value; and
said comparator compares the value of the first signal with the comparison voltage.

13. The power conversion apparatus according to claim 11, wherein said correcter obtains the first signal at a leading edge and a trailing edge of a fifth drive signal output to said switching device; and
said correcter corrects, at the leading edge of the fifth signal, the reference value on the basis of the first signal obtained at another leading edge, and corrects, at the trailing edge of the fifth signal, the reference value on the basis of the first signal obtained at another trailing edge; and
said another leading edge is a first predetermined number of the leading edges previous to the leading edge of the fifth signal at which said correcter corrects the reference value, and said another trailing edge is a second predetermined number of the trailing edges previous to the trailing edge of the fifth signal at which said correcter corrects the reference value.

14. The power conversion apparatus according to claim 11, wherein said correcter obtains the first signal at a first leading edge of fifth drive signal output to said switching device after said power conversion apparatus is started, and corrects, at all the subsequent leading edges of the fifth signal, the reference value on the basis of the first signal obtained at the first leading edge, and
said correcter obtains the first signal at a first trailing edge of the fifth signal after said power conversion apparatus is started, and corrects, at all the subsequent trailing edges of the fifth signal, the reference value on the basis of the first signal obtained at the first trailing edge.

15. The power conversion apparatus according to claim 11, wherein said correcter comprises a storage circuit which stores the third signal.

16. The power conversion apparatus according to claim 12, wherein said correcter comprises a storage circuit which stores the third signal.

17. The power conversion apparatus according to claim 11, wherein said device controller comprises a level-shifter which exchanges signals between said device controller and a controller which controls said power conversion apparatus.

18. A power conversion system comprising:
at least one power conversion apparatus for an upper arm including
a power switching device;
a voltage sensor which detects an output voltage of said switching device to output a first signal depending on the output voltage;
a current sensor which detects an output current of said switching device to output a second signal depending on the output current; and
a device controller connected to said switching device, said voltage sensor, and said current sensor;
wherein said device controller includes:
a driver connected to said switching device; and
a correcter connected to said driver, said voltage sensor and said current sensor;
said driver outputs a third drive signal to said switching device; and
said correcter
obtains the first signal from said voltage sensor, the second signal from said current sensor, and the third signal from said driver;
calculates a switching loss by using a value of the first signal and a value of the second signal;
compares a value of the switching loss with a first reference value, and the value of the first signal with a second reference value; and
corrects the value of the third signal, when at least one of a condition in which the value of the switching loss exceeds the first reference value and a condition in which the value of the first signal exceeds the second reference value is satisfied, such that the exceeding value is not larger than the corresponding reference value; and
at least one power conversion apparatus for a lower arm including
a power switching device;
a voltage sensor which detects an output voltage of said switching device to output a first signal depending on the output voltage;
a current sensor which detects an output current of said switching device to output a second signal depending on the output current; and
a device controller connected to said switching device, said voltage sensor, and said current sensor;
wherein said device controller includes:
a driver connected to said switching device; and
a correcter connected to said driver, said voltage sensor and said current sensor;
said driver outputs a third drive signal to said switching device; and
said correcter
obtains the first signal from said voltage sensor, the second signal from said current sensor, and the third signal from said driver;
calculates a switching loss by using a value of the first signal and a value of the second signal;
compares a value of the switching loss with a first reference value, and the value of the first signal with a second reference value; and corrects the value of the third signal, when at least one of a condition in which the value of the switching loss exceeds the first reference value and a condition in which the value of the first signal exceeds the second reference value is satisfied, such that the exceeding value is not larger than the corresponding reference value.

19. A method for correcting a drive signal output to a power switching device, comprising the steps of:

obtaining a first signal depending on an output voltage of said switching device, a second signal depending on an output current of said switching device, and a third drive signal output to said power switching device;

calculating a switching loss by using a value of the first signal and a value of the second signal;

comparing a value of the switching loss with a first reference value, and the value of the first signal with a second reference value; and correcting the value of the third drive signal, when at least one of a condition in which the value of the switching loss exceeds the first reference value and a condition in which the value of the first signal exceeds the second reference value is satisfied, such that the exceeding value is not larger than the corresponding reference value.

* * * * *